United States Patent
Korobkov

(10) Patent No.: US 7,107,200 B1
(45) Date of Patent: Sep. 12, 2006

(54) METHOD AND APPARATUS FOR PREDICTING CLOCK SKEW FOR INCOMPLETE INTEGRATED CIRCUIT DESIGN

(75) Inventor: Alexander I. Korobkov, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 437 days.

(21) Appl. No.: 10/678,535

(22) Filed: Oct. 3, 2003

(51) Int. Cl.
*G06F 17/50* (2006.01)

(52) U.S. Cl. .......................................... 703/13; 716/6

(58) Field of Classification Search .................. 703/13
See application file for complete search history.

(56) References Cited

U.S. PATENT DOCUMENTS

| | | | |
|---|---|---|---|
| 5,598,006 A * | 1/1997 | Stringa .................. | 250/559.46 |
| 5,866,924 A * | 2/1999 | Zhu ........................... | 257/208 |
| 5,912,820 A * | 6/1999 | Kerzman et al. ............... | 716/6 |
| 6,311,313 B1 * | 10/2001 | Camporese et al. ........... | 716/6 |
| 6,397,375 B1 * | 5/2002 | Block et al. .................. | 716/14 |
| 6,496,966 B1 * | 12/2002 | Barney et al. ................. | 716/10 |
| 6,934,924 B1 * | 8/2005 | Paul et al. .................... | 716/11 |
| 2003/0043936 A1 * | 3/2003 | Forbes ....................... | 375/329 |
| 2003/0051221 A1 * | 3/2003 | Mizuno et al. ............... | 716/12 |

OTHER PUBLICATIONS

P.J. Restle et al., "A Clock Distribution Network for Microprocessors", 2000 IEEE, pp. 184-187.
Ghun Kim et al., "An Effective Modeling Technique for the Delay Calculation and the Skew Analysis of Clock Grid Designs", 2000 IEEE, pp. 340-344.

* cited by examiner

*Primary Examiner*—Kamini Shah
*Assistant Examiner*—Shambhavi Patel
(74) *Attorney, Agent, or Firm*—Gunnison, McKay & Hodgson, L.L.P.

(57) ABSTRACT

Prediction of a clock skew for an incomplete integrated circuit design, includes (a) selecting a first metal layer having at least one clock design figure, (b) placing, for a minimum clock skew prediction, clock source locations on the clock design figure in accordance with a first predetermined minimum distance between adjacent clock source locations, (c) placing, for a maximum clock skew prediction, a clock source location on a largest clock design figure in the first layer, such that the clock source location has a largest distance from a via to a lower layer, and (d) placing, for an intermediate clock skew prediction, clock source locations on intersections between the clock design figure and a virtual clock grid created for the first metal layer, the virtual clock grid having a predetermined offset from a design boundary and a predetermined pitch between grid lines.

66 Claims, 16 Drawing Sheets

METHOD AND APPARATUS FOR PREDICTING CLOCK SKEW FOR INCOMPLETE INTEGRATED CIRCUIT DESIGN

FIELD OF THE INVENTION

The present invention relates to a method and apparatus for on-chip clock timing and skew verification. More particularly, the present invention relates to a method and apparatus for predicting a clock skew for an incomplete integrated circuit design including at least one clock design figure for routing a clock signal.

BACKGROUND OF THE INVENTION

During a chip design cycle, it is important to verify the behavior of the most critical signal paths at an earlier design stage in order to understand and identify possible problems and finding solutions thereof, which will be used at subsequent tuning steps to meet the design requirements and specification. For example, a clock signal controlling the data transfer within the system is such a critical signal. In the clock routing design, the most important criteria which directly affect the entire chip performance is a clock skew, i.e., the maximum difference in the signal arrival time at two different components over all clock destinations. Since a clock period (or clock cycle) must allow for logical completion of the task as well as extra time for deviations in clock arrival time among functional elements, the smaller amount of the maximum deviation in the clock arrival time allows the use of faster clocks. Thus, controlling the clock skew is the key to improve circuit performance.

In a complete circuit design, the input clock excitation signals are typically applied at particular locations according to the real on-chip clock source connections. Ideally, the clock signal is distributed in such a way that the interconnections carrying the clock signal to functional sub-blocks are equal in length. FIG. 1 schematically illustrates an example of a complete grid-based clock distribution network for a high performance processor design. As shown in FIG. 1, the clock distribution network design is based on a special purpose clock grid 10. The clock grid 10 is driven by a pregrid 12 which has a tree structure. The major purpose of the clock grid 10 is to deliver the clock signal to each and every destination with a minimum skew. Typically, a circuit design has a hierarchical structure, and, in a bottom-up design flow, circuit designs for smaller blocks are getting completed first. In FIG. 1, four blocks 1–4 are shown, and some of the completed metal layers 14 are illustrated for the block 4. As shown in FIG. 1, the completed clock design figures (clock signal lines) are connected to the clock grid 10 at specific locations, i.e., clock hook-ups 16.

FIG. 2 schematically illustrates a typical process for the block-level clock skew verification for a complete design. As shown in FIG. 2, the locations for clock grid hook-ups are identified based on the real grid geometry, and the corresponding ports are assigned (20). Voltage sources are then connected to the block-level netlist ports according to the identified clock grid hook-ups (22). Circuit simulation for the block-level netlist is run using a simulation program such as SPICE (24), and clock delays/skews at clock receivers such as functional elements are reported (26).

FIG. 3 schematically illustrates a typical process for the full-chip clock skew verification for a complete design. As shown in FIG. 3, the locations for clock grid hook-ups from each block are identified and the corresponding ports are assigned (30). Then circuit extraction is run for the full chip without blocks (inside-block information) to create a detailed netlist for the full chip (32). Extraction is also run for the blocks to create a netlist for each block (34). Typically, circuit extraction identifies the individual transistors and their interconnections on various layers, as well as the parasitic resistances and capacitances that are present between these layers. The extracted netlist provides a very accurate estimation of the actual device dimensions and device parasitics that determine the circuit performance. The extracted netlist file and parameters are subsequently used for verification process and post layout simulations. The extracted netlist for each block is replaced with a reduced order model which is computed for each grid hook-up port (36). Circuit simulation for the full-chip netlist is run using a simulation program such as SPICE (38), and then clock skew verification is run for each block (40).

However, in incomplete circuit design, some of such locations may be missing or physically disconnected. For example, the blocks 1, 2, 3, . . . may be prepared by different persons independently, and it may be necessary to verify clock skew distribution at a particular stage. However, some of the blocks may not have real grid connections yet and thus such a clock skew verification may not be available at the early stage.

BRIEF DESCRIPTION OF THE INVENTION

Prediction of a clock skew for an incomplete integrated circuit design, the design including at least one clock design figure for routing a clock signal, includes (a) selecting, from the top, a first metal layer having at least one clock design figure, (b) placing, if a minimum clocks skew is to be predicted, clock source locations on the clock design figure in accordance with a first predetermined minimum distance between adjacent clock source locations, (c) placing, if a maximum clock skew is to be predicted, a clock source location on a first clock design figure having a largest size in the first layer, such that the clock source location has a largest distance from a via to a lower layer, and (d) placing, if an intermediate clock skew is to be predicted, clock source locations on intersections between the clock design figure and a virtual clock grid created for the first metal layer, the virtual clock grid having a predetermined offset from a design boundary and a predetermined pitch between grid lines.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Figure 1:
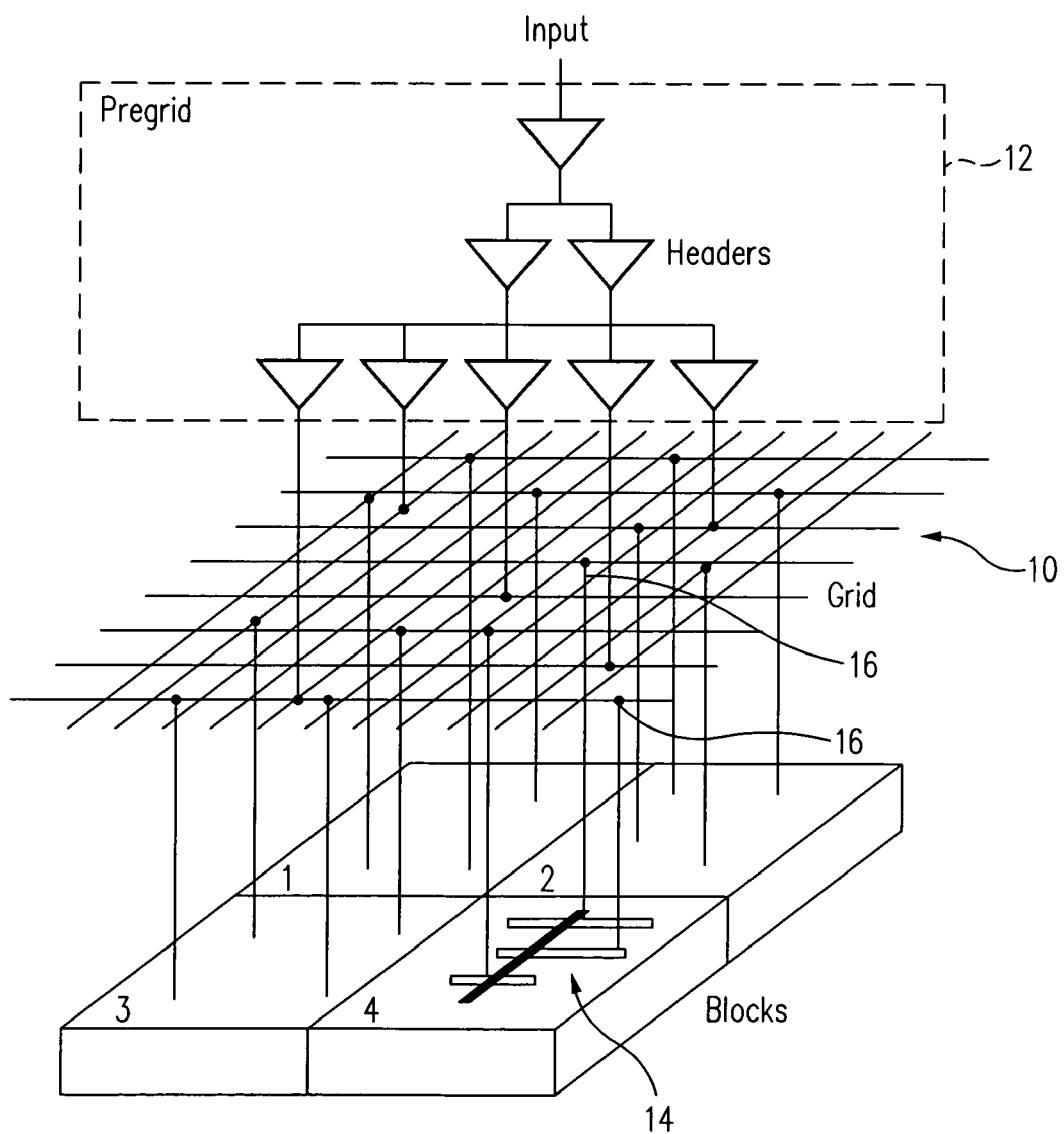
FIG. 1 is a diagram schematically illustrating an example of a complete grid-based clock distribution network for a high performance processor design.
Figure 2:
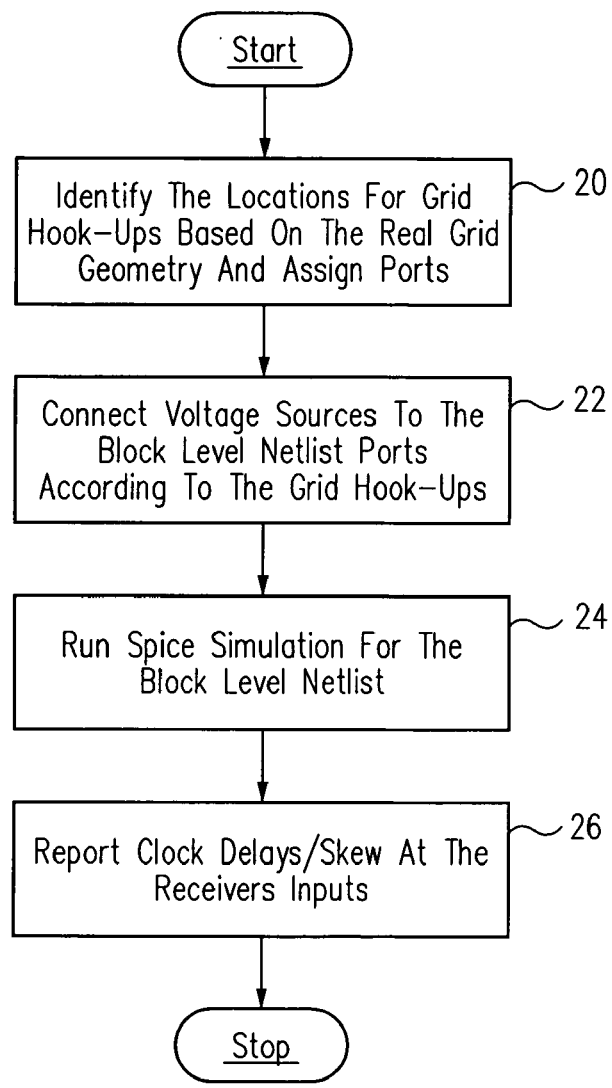
FIG. 2 is a diagram schematically illustrating a typical process flow for the block-level clock skew verification for a complete design.

Embodiments of the present invention are described herein in the context of a method and apparatus for predicting a clock skew for an incomplete circuit design. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with one embodiment of the present invention, the components, process steps, and/or data structures may be implemented using various types of operating systems (OS), computing platforms, firmware, computer programs, computer languages, and/or general-purpose machines. The method can be implemented as a programmed process running on processing circuitry. The processing circuitry can take the form of numerous combinations of processors and operating systems, or a stand-alone device. The process can be implemented as instructions executed by such hardware, hardware alone, or any combination thereof. The software may be stored on a program storage device readable by a machine.

In addition, those of ordinary skill in the art will recognize that devices of a less general purpose nature, such as hardwired devices, field programmable logic devices (FPLDs), including field programmable gate arrays (FPGAs) and complex programmable logic devices (CPLDs), application specific integrated circuits (ASICs), or the like, may also be used without departing from the scope and spirit of the inventive concepts disclosed herein.

In accordance with one embodiment of the present invention, the method may be implemented on a data processing computer such as a personal computer, workstation computer, mainframe computer, or high performance server running an OS such as Solaris® available from Sun Microsystems, Inc. of Palo Alto, Calif., Microsoft® Windows® XP and Windows® 2000, available from Microsoft Corporation of Redmond, Wash., or various versions of the Unix operating system such as Linux available from a number of vendors. The method may also be implemented on a multiple-processor system, or in a computing environment including various peripherals such as input devices, output devices, displays, pointing devices, memories, storage devices, media interfaces for transferring data to and from the processor(s), and the like. In addition, such a computer system or computing environment may be networked locally, or over the Internet.

Figure 4:
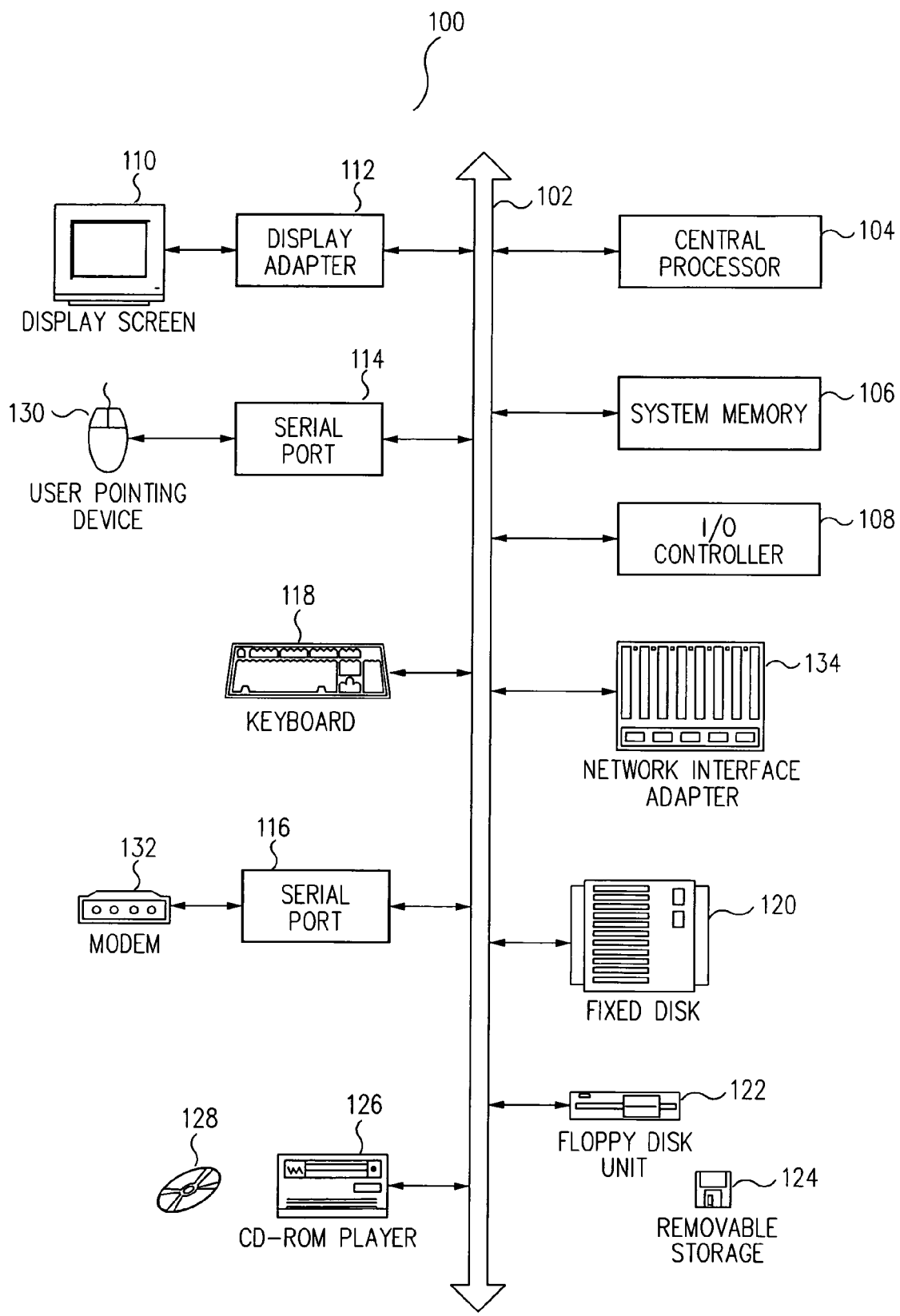
FIG. 4 is a block diagram schematically illustrating a computer system suitable for implementing aspects of the present invention.

FIG. 4 depicts a block diagram of a computer system 100 suitable for implementing aspects of the present invention. As shown in FIG. 4, computer system 100 includes a bus 102 which interconnects major subsystems such as a central processor 104, a system memory 106 (typically RAM), an input/output (I/O) controller 108, an external device such as a display screen 110 via display adapter 112, serial ports 114 and 116, a keyboard 118, a fixed disk drive 120, a floppy disk drive 122 operative to receive a floppy disk 124, and a CD-ROM player 126 operative to receive a CD-ROM 128. Many other devices can be connected, such as a pointing device 130 (e.g., a mouse) connected via serial port 114 and a modem 132 connected via serial port 116. Modem 132 may provide a direct connection to a remote server via a telephone link or to the Internet via a POP (point of presence). Alternatively, a network interface adapter 134 may be used to interface to a local or wide area network using any network interface system known to those skilled in the art (e.g., Ethernet, xDSL, AppleTalk™).

Many other devices or subsystems (not shown) may be connected in a similar manner. Also, it is not necessary for all of the devices shown in FIG. 4 to be present to practice the present invention, as discussed below. Furthermore, the devices and subsystems may be interconnected in different ways from that shown in FIG. 4. The operation of a computer system such as that shown in FIG. 4 is readily known in the art and is not discussed in detail in this application, so as not to overcomplicate the present discussion. Code to implement the present invention may be operably disposed in system memory 106 or stored on storage media such as fixed disk 120, floppy disk 124 or CD-ROM 128.

Figure 3:
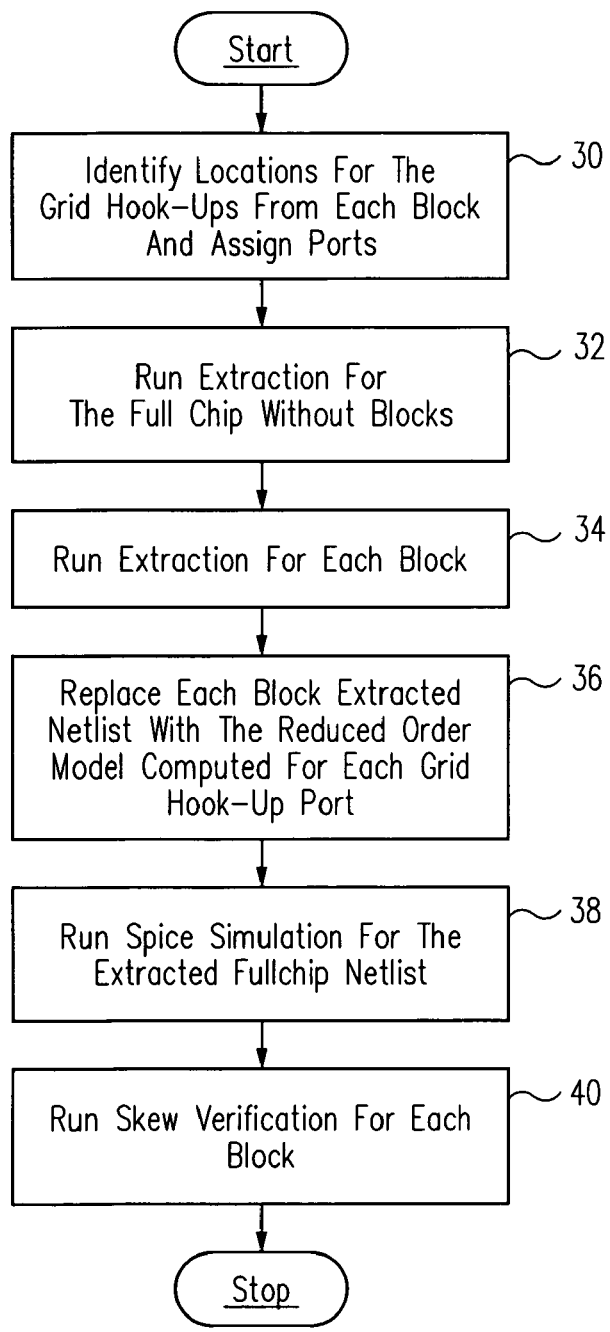
FIG. 3 is a diagram schematically illustrating a typical process flow for the full-chip clock skew verification for a complete design.
Figure 5:
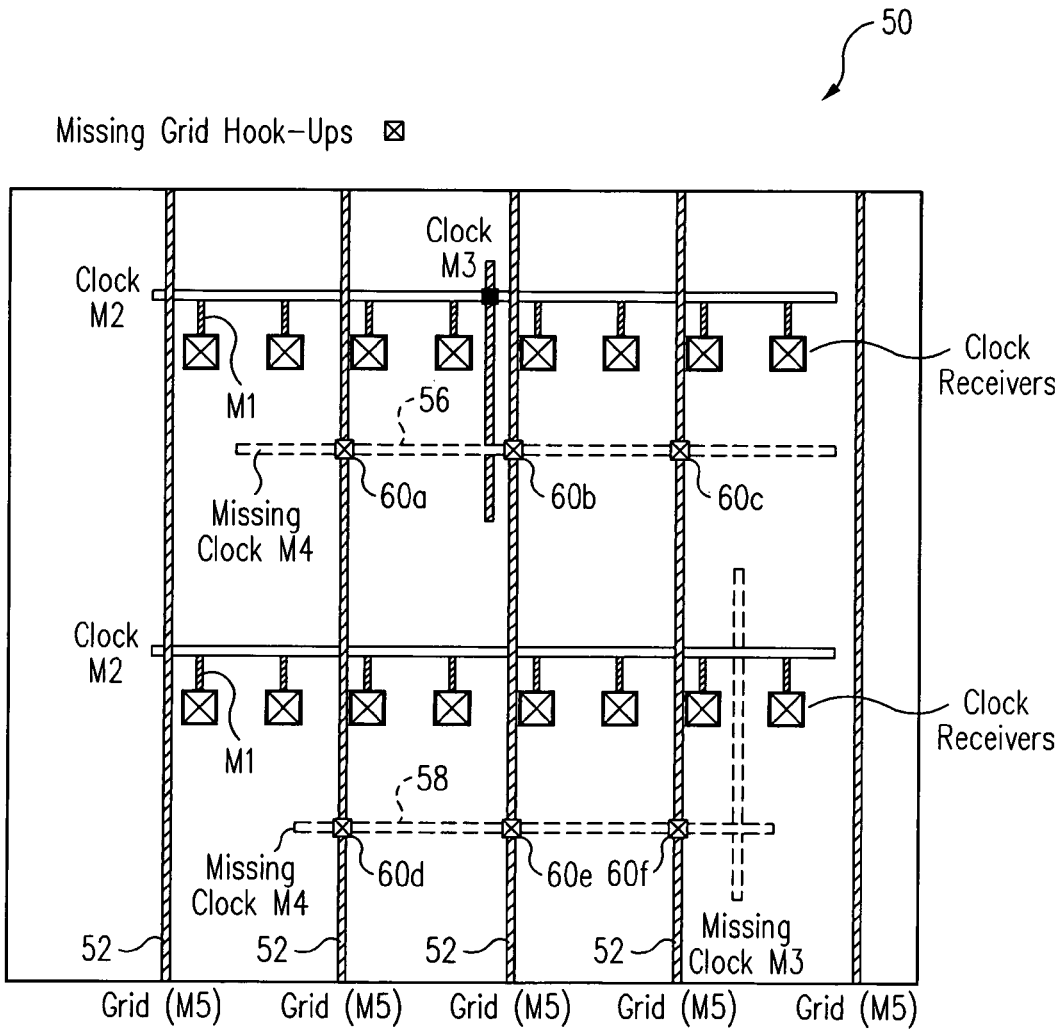
FIG. 5 is a diagram schematically illustrating an example of an incomplete circuit design with a block-level clock distribution network in accordance with one embodiment of the present invention.

FIG. 5 schematically illustrates an example of an incomplete circuit block design 50 with a block-level clock distribution network in accordance with one embodiment of the present invention. In FIG. 5, the clock distribution network includes metal layers M1 through M4 (from the bottom to the top) and a clock grid 52 formed in metal layer M5. The clock design figures in the metal layer M1 are connected to clock receivers such as functional elements. Since the circuit design is incomplete, some clock figures are still missing, for example, a clock FIG. 54 in the metal layer M3, and clock FIGS. 56 and 58 in the metal layer M4. In accordance with one embodiment of the present invention, the missing grid hook-ups, i.e., connections between the clock grid 52 and the missing clock FIGS. 56 and 58 in the metal layer M4 are identified as "virtual" grid hook-ups 60 (60*a*, 60*b*, . . . ). It should be noted that the number of the metal layers is not limited to 5 (M1 through M5), and the clock grid 52 is not limited to be formed in the metal layer M5. Using the virtual grid hook-ups, the clock signal sources are connected to the block-level netlist and the clock skew verification is run for each block. The results of block level skew verification can be used at the later stage for the full-chip verification as shown in FIG. 3. In this description, the terms of clock figure, clock design figure, and clock rouging figure are used interchangeably.

Figure 6:
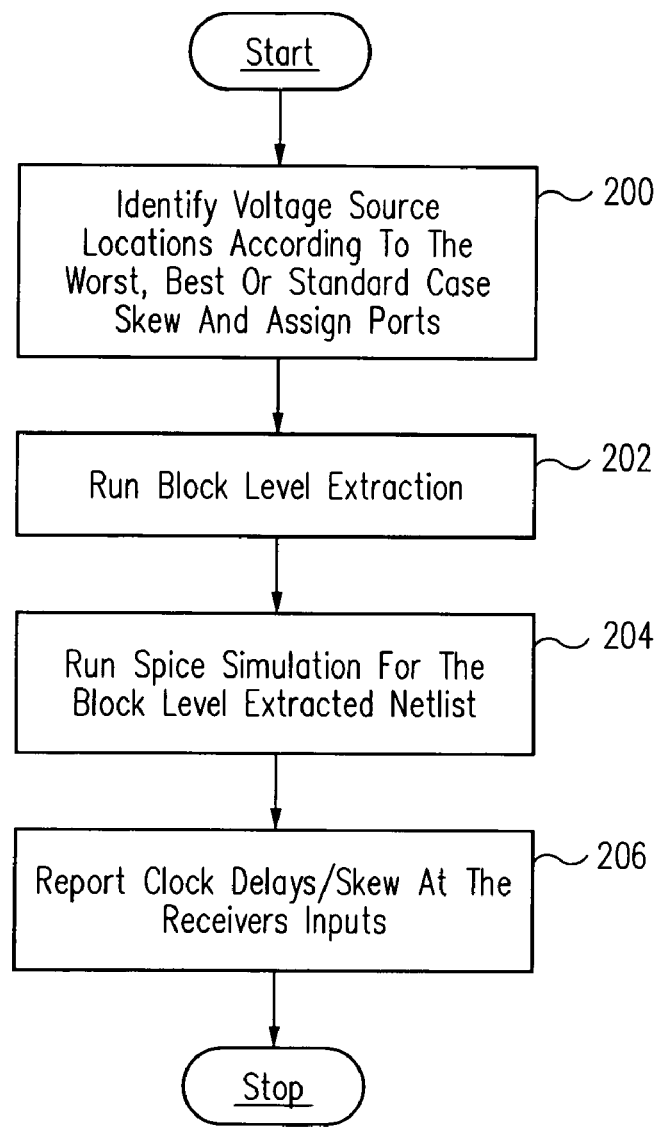
FIG. 6 is a process flow diagram schematically illustrating a method for predicting a clock skew for an incomplete integrated circuit design in accordance with one embodiment of the present invention.

FIG. 6 schematically illustrates a method for predicting a clock skew for an incomplete integrated circuit design in accordance with one embodiment of the present invention. The incomplete integrated circuit design includes at least one clock design figure for routing a clock signal. For example, such an incomplete integrated circuit design may be the incomplete circuit block design 50 described above, and typically no actual clock grid hook-ups are provided. It should be noted that the connectivity extraction has been done and thus it is known which design figures belong to the clock network, and which clock figures are connected each other. That is, all clock figures, if any, in each metal layer are identified and the connectivity among the clock figures is also identified.

In accordance with one embodiment of the present invention, the voltage source locations are identified in accordance with a selected clock skew scenario: the best (minimum) skew; the worst (maximum) skew; and/or the standard (medium) skew, and ports are assigned based on the identified voltage source locations (200). The clock signal source locations are provided such that the clock signal is delivered to all destinations (clock receivers) although some upper layer clock figures may be missing and actual clock grid hook-ups may not exist. The "standard" case is considered to be the closest scenario to the actual clock skew in a final complete design, while the best and worst cases can be used to identify the areas of subsequent tuning i.e., how much skew degradation/improvement can be reached. As shown in FIG. 6, block-level extraction is run to create a block-level netlist with the provided voltage source locations (202). Circuit simulation for the block level netlist is run using a simulation program such as SPICE (204), and clock delays/skews at the clock receivers such as functional elements are reported (206).

Figure 7:
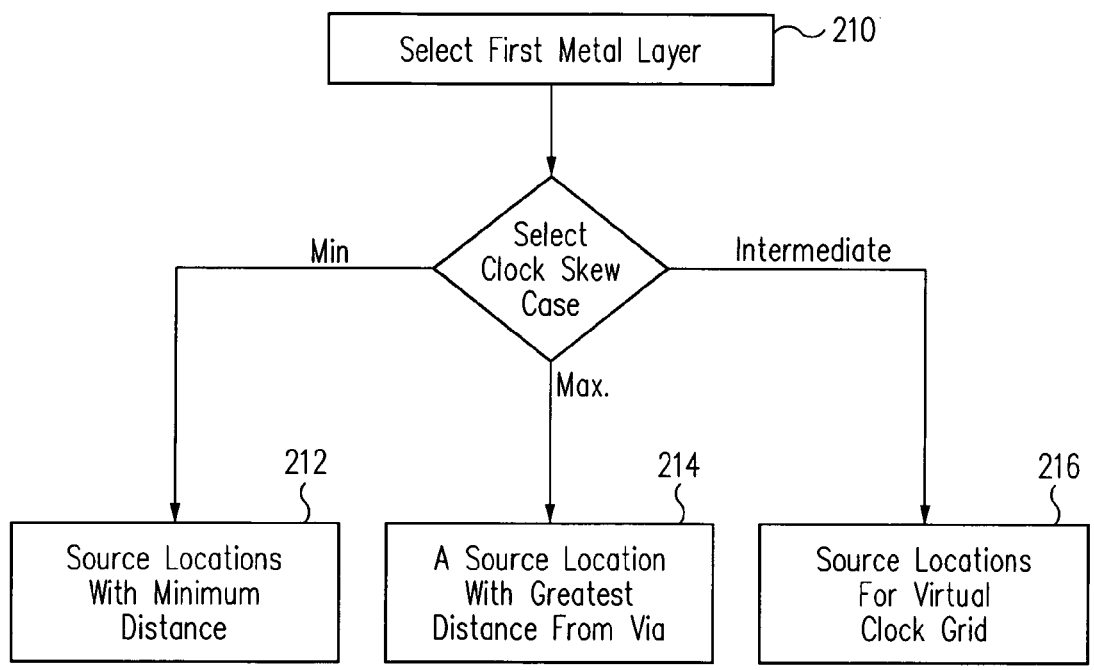
FIG. 7 is a process flow diagram schematically illustrating a method for predicting a clock skew for an incomplete integrated circuit design in accordance with one embodiment of the present invention.

FIG. 7 schematically illustrates a method for predicting a clock skew for an incomplete integrated circuit design in accordance with one embodiment of the present invention. In identifying the voltage source locations (200) in FIG. 6, a first metal layer having at least one clock design figure is selected from the top of the metal layers (210). The first metal layer is a first top layer including clock figure(s) under the clock grid. In the example shown in FIG. 5, the metal layer M3 is the first metal layer since the metal layer M4 does not have clock figures yet. The "virtual" clock source locations are determined and placed on the clock figures in the first metal layer based on a selected clock skew case scenario. If the minimum clocks skew is to be predicted, clock source locations are placed on the clock design figure in accordance with a first predetermined minimum distance between adjacent clock source locations (212). If a maximum clock skew is to be predicted, a clock source location is placed on a first clock design figure having a largest size in the first layer, such that the clock source location has a largest distance from a via to a lower layer (214). If an intermediate clock skew is to be predicted, clock source locations are placed on intersections between the clock design figure and a virtual clock grid created for the first metal layer (216). The virtual clock grid has a predetermined offset from a design boundary and a predetermined pitch between grid lines.

Figure 8:
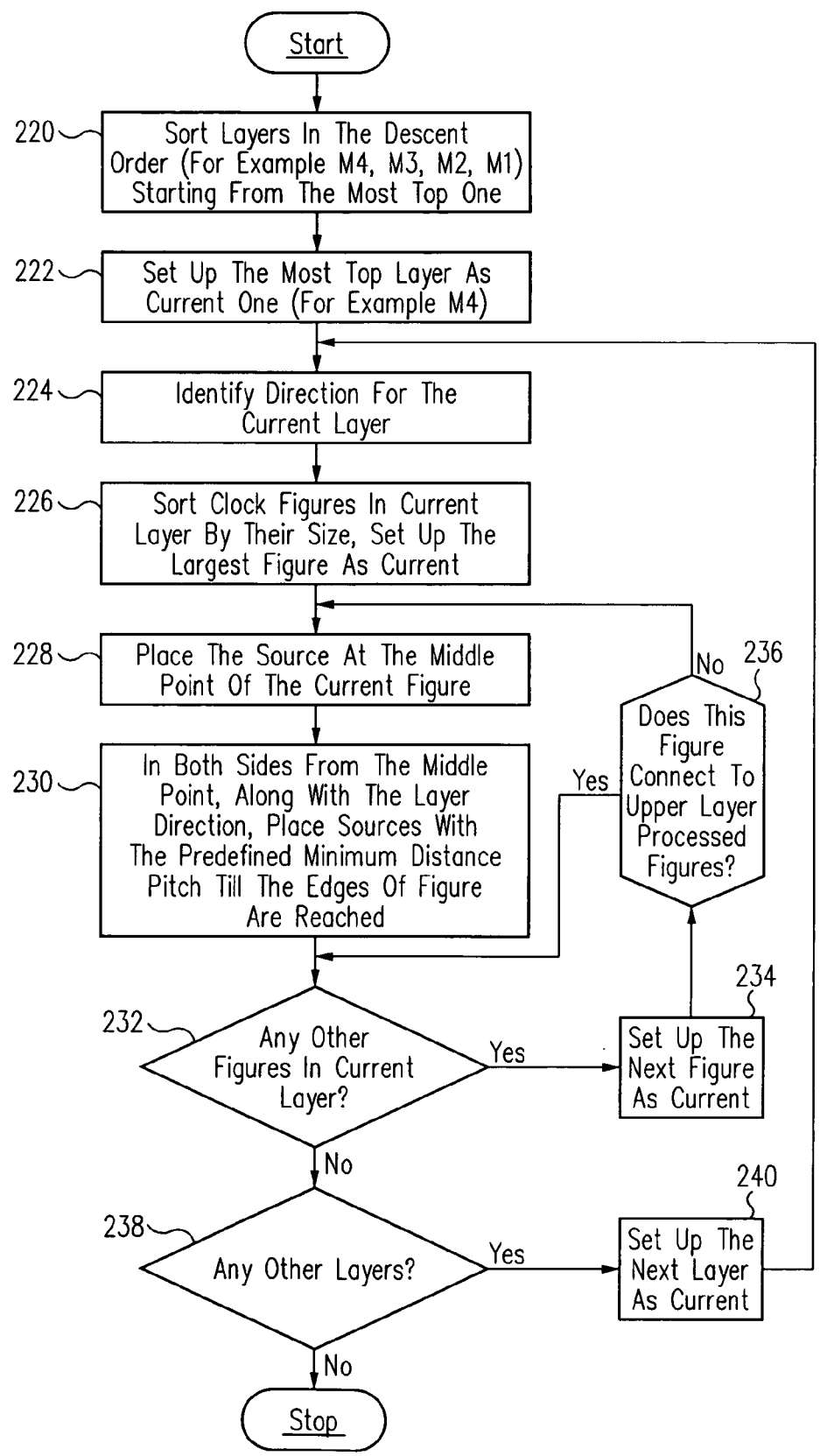
FIG. 8 is a process flow diagram schematically illustrating a method for predicting a minimum clock skew for an incomplete integrated circuit design in accordance with one embodiment of the present invention.

FIG. 8 schematically illustrates a method for predicting a minimum clock skew for an incomplete integrated circuit design in accordance with one embodiment of the present invention. For example, this method is performed as the minimum clock skew prediction (212) described above.

As shown in FIG. 8, the metal layers of the circuit design are sorted from the top in the descent order, for example, M4, M3, M2, M1 (220). The most top layer is set as a "current layer" to be processed (222). For example, the metal layer M4 is first set as the current layer. If the metal layer M4 includes no clock design figure, the next metal layer M3 may be set as the current layer. Then, a direction of the clock design figure(s) is identified for the current layer (224). As shown in FIG. 5, the direction of clock design figures in one metal layer is typically perpendicular to that of an adjacent metal layer. However, the present invention is not limited to specific direction of the clock design figures in the metal layers. Then, the clock design figures in the current layer are sorted in accordance with sizes thereof, and the largest clock design figure is set as a "current figure (226). The sorting may include determining the order of the clock design figures based on their sizes, arranging the corresponding data objects of the clock design figures based on the size, creating the association between the order and the data objects, or the like.

A first clock source is then placed on a selected location on the current clock figure (228). For example, the first clock source location may be the middle point of the current figure, or may be an end point (or edge) of the current figure. Starting from the first clock source location, additional clock sources location are placed along the layer direction with a predefined pitch (i.e., distance between the adjacent clock sources) until the edge(s) of the current clock figure (230). For example, if the first clock source location is placed at the middle point, the additional clock sources location are placed in the both sides in the metal layer direction until reaching the both edges of the clock figure. In the case where the first clock source location is placed at an end of the current figure, the additional clock sources locations are placed along the clock figure toward the other edge of the clock figure. The clock source locations may be placed such a manner that the number of the clock source locations placed on a clock figure is maximized under the predefined pitch.

After placing all of the clock source locations on the first clock figure, if there are any other clock figures on the current layer (232), a next clock figure is set as a current clock figure (234). For example, the next clock figure may be a second largest clock figure in the current metal layer. Then it is determined if the current figure is connected to any clock figure on the upper layer, if any, already processed (236). If the current clock figure is connected to an already-processed upper-layer clock figure, the process returns to the determination for a next clock figure (232). If the current clock figure is not connected to any already-processed upper-layer clock figure, the process returns to the placing a first clock source location (228), and the current clock figure is provided with clock source locations in the same manner (230). It should be noted if the current clock figure is connected to an already-processed clock figure in the current metal layer, not in the upper-layer, the clock figure is provided with the clock source locations. The processes 228–236 are iteratively repeated until no other clock figure is remaining in the current layer.

Similarly, the processes 224–236 are iteratively repeated until no other metal layer including clock figure(s) is remaining (238, 240). For example, a second metal layer having at least one clock design figure is selected, and clock source locations are placed on the clock design figure in the second metal layer in accordance with a second predetermined minimum distance between adjacent clock source locations, if the clock design figure in the second metal layer is not connected to a clock design figure in an upper metal layer. The pitch (minimum distance) for placing the clock source locations may be different in different metal layers.

Figure 9:
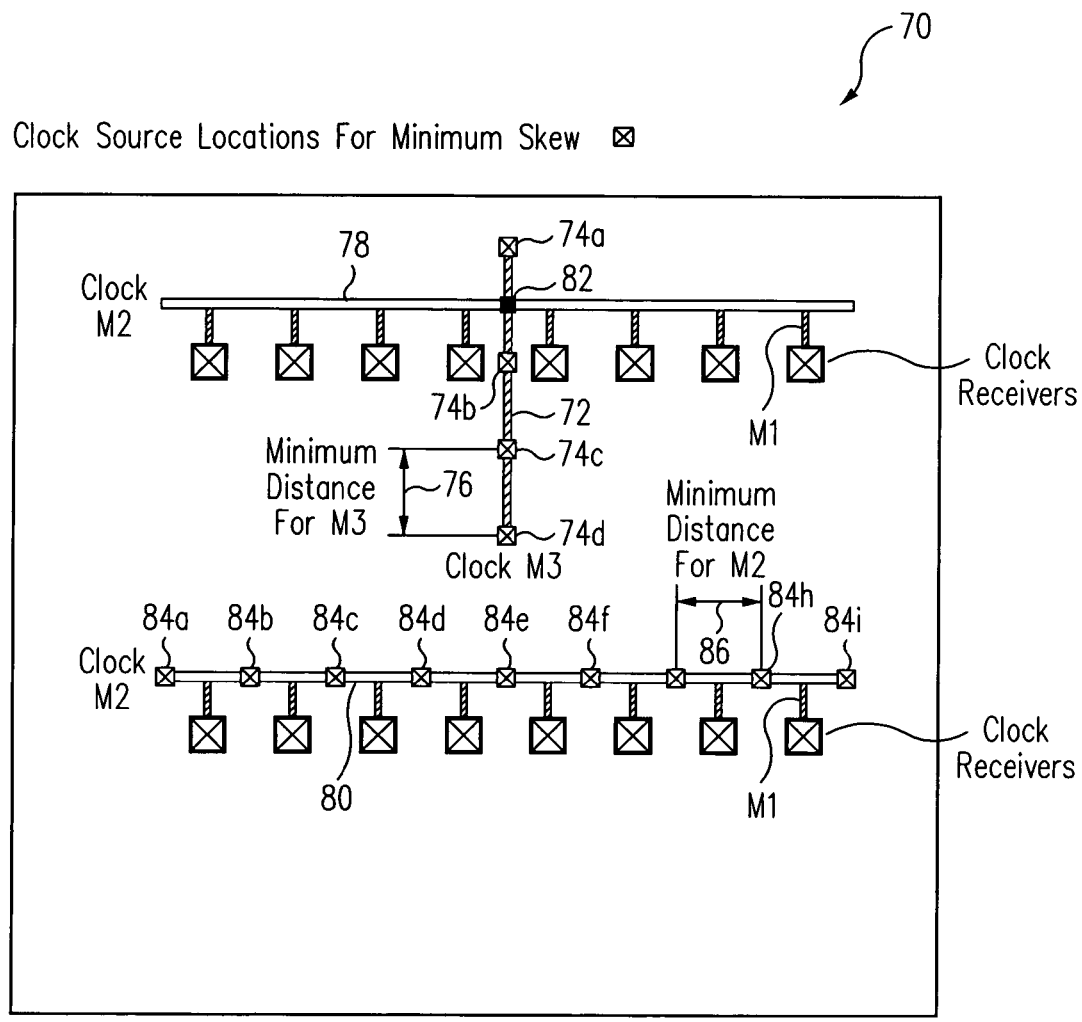
FIG. 9 is a diagram schematically illustrating an example of an incomplete circuit block design and clock source locations placed thereon in accordance the embodiment of the present invention illustrated in FIG. 8.

FIG. 9 schematically illustrates an example of an incomplete circuit block desing 70 and clock source locations placed thereon in accordance with the above embodiment illustrated in FIG. 8. In this example, clock design figures in the metal layer M4 are missing (as shown in FIG. 5), the metal layer M3 is the first metal layer having a clock FIG. 72. Clock source locations 74 (74a, 74b, . . . ) are placed in accordance with a pitch 76 for the metal layer M3. Since there is no other clock figure in the metal layer M3 in this example, the process goes to the metal layer M2 which includes clock FIGS. 78 and 80. The clock FIG. 78 is connected to the clock FIG. 72 in the upper metal layer M3 through a via 82, and thus clock source locations are not placed on the clock FIG. 78. However, the clock FIG. 80 is not connected to any clock figure in the upper metal layer M3, clock source locations 84 (84a, 84b, . . . ) are placed in accordance with a pitch 86 for the metal layer M2.

Figure 10:
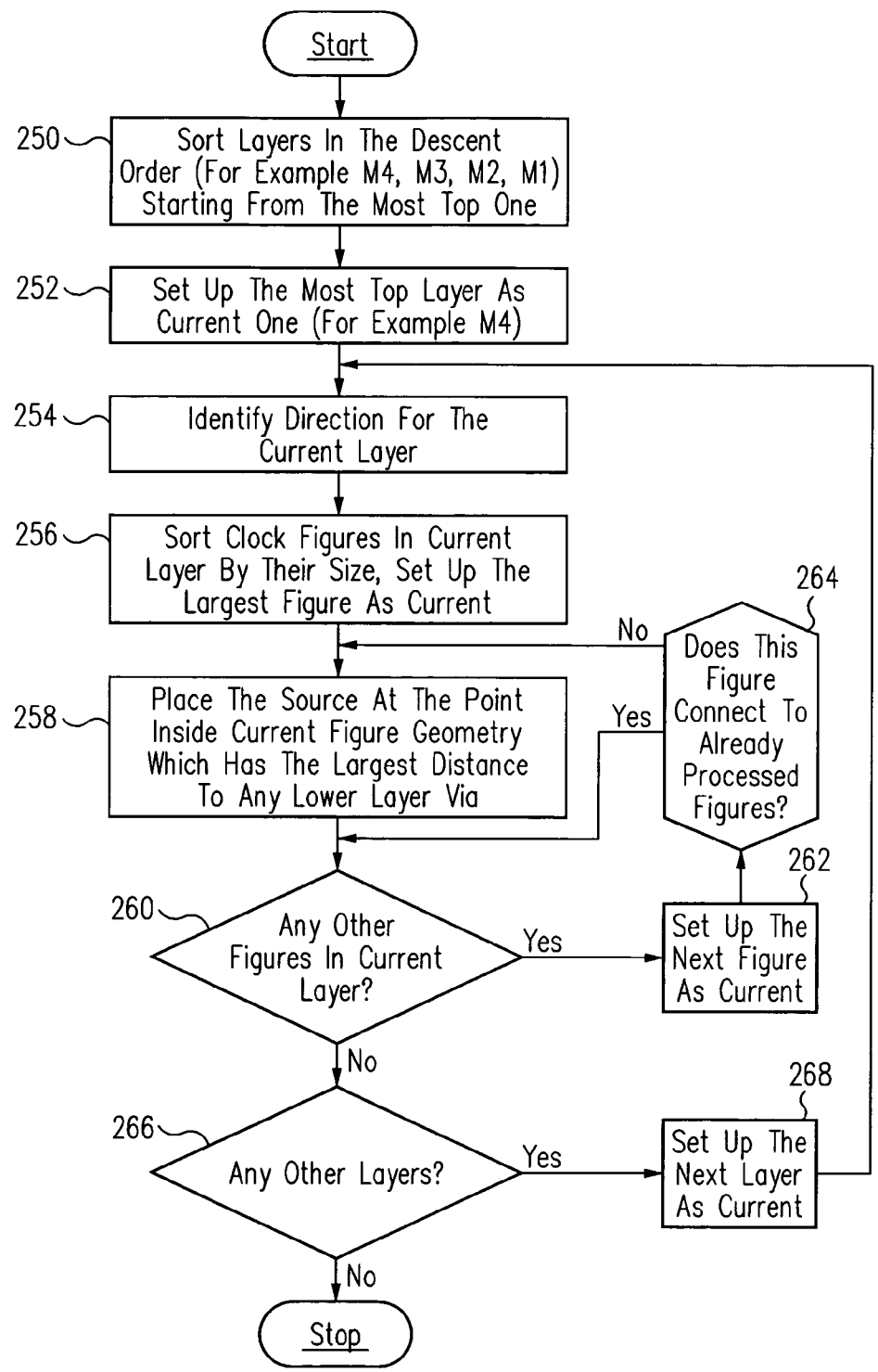
FIG. 10 is a process flow diagram schematically illustrating a method for predicting a maximum clock skew for an incomplete integrated circuit design in accordance with one embodiment of the present invention.

FIG. 10 schematically illustrates a method for predicting a maximum clock skew for an incomplete integrated circuit design in accordance with one embodiment of the present invention. For example, this method is performed as the maximum clock skew prediction (214) described above.

As shown in FIG. 10, the metal layers of the circuit design are sorted from the top in the descent order, for example, M4, M3, M2, M1 (250). The most top layer is set as a "current layer" to be processed (252). For example, the metal layer M4 is first set as the current layer. If the metal layer M4 includes no clock design figure, the next metal layer M3 may be set as the current layer. Then, a direction of the clock design figure(s) is identified for the current layer (254). Then, the clock design figures in the current layer are sorted in accordance with sizes thereof, and the largest clock design figure is set as a current figure (256). The sorting may include determining the order of the clock design figures based on their sizes, arranging the corresponding data objects of the clock design figures based on the size, creating the association between the order and the data objects, or the like.

A clock source location is then placed on the current (i.e., the largest) clock figure such that the clock source location has a largest distance from a via to a lower layer (258). For example, if the via exist on some intermediate point of the clock figure, the clock source location is placed at an edge of the clock figure having a farther distance from the via. If there are any other clock figures on the current layer (260), a next clock figure is set as the current clock figure (262). For example, the next clock figure may be a second largest clock figure in the current metal layer. Then it is determined if the current clock figure is connected to any clock figure already processed, whether on the same layer or the upper layer (236). If the current clock figure is connected to any already-processed clock figure, the process returns to the determination for a next clock figure (260). If the current clock figure is not connected to any already-processed clock figure, the process returns to the placing of the clock source location (258), and the current clock figure is provided with a clock source location in the same manner. The processes 258–264 are iteratively repeated until no other clock figure is remaining in the current layer.

Similarly, the processes 254–264 are iteratively repeated until no other metal layer having clock figure(s) is remaining (266, 268). For example, a second metal layer having at least one clock design figure is selected, and a clock source location is placed on the clock design figure in the second metal layer such that the clock source location has a largest distance from a via to a lower layer, if the clock design figure is not connected to any already-processed clock design figure, and so on.

Figure 11:
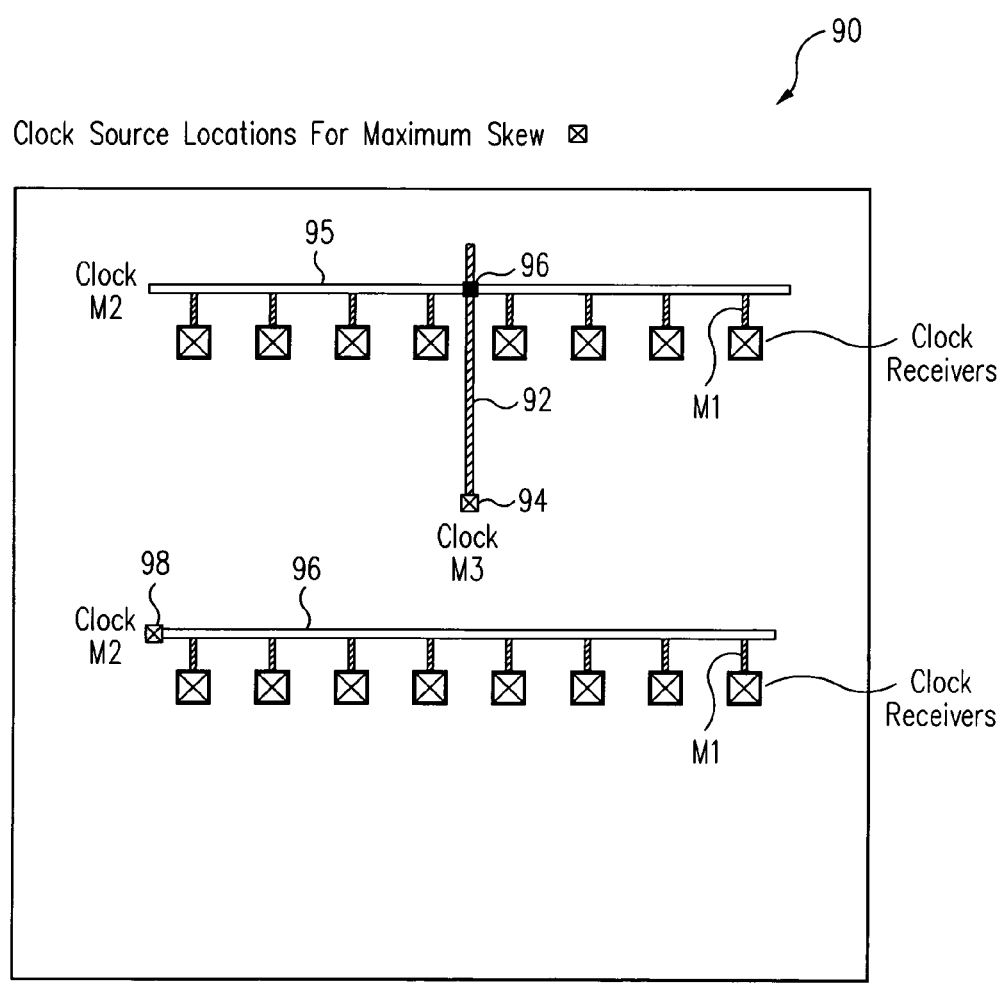
FIG. 11 is a diagram schematically illustrating an example of an incomplete circuit block design and clock source locations placed thereon in accordance with the embodiment of the present invention illustrated in FIG. 10.

FIG. 11 schematically illustrates an example of an incomplete circuit block design 90 and clock source locations placed thereon in accordance with the above embodiment illustrated referring to FIG. 10. In this example, similarly to the circuit block 70, clock design figures in the metal layer M4 are missing (as shown in FIG. 5), and thus the metal layer M3 is the first layer including a clock FIG. 92. A clock source 94 is placed on the clock FIG. 92 such that the clock source location has the largest distance from a via 96 to the lower layer M2. Since there is no other clock figure in the metal layer M3 in this example, the process goes to the metal layer M2 which includes clock FIGS. 95 and 96. The clock FIG. 95 is connected to the already-processed clock FIG. 92, and thus no clock source is placed on the clock FIG. 95. However, the clock FIG. 96 is not connected to any clock figure already processed, a clock source 98 is placed such that the clock source location has the largest distance from a via to the lower layer M1. In this example, since a number of clock receivers are connected via contacts of the metal layer M1, the clock source is placed at one edge of the clock FIG. 96, providing the maximum distance from the M1 contacts in the vicinity of the other edge.

Figure 12:
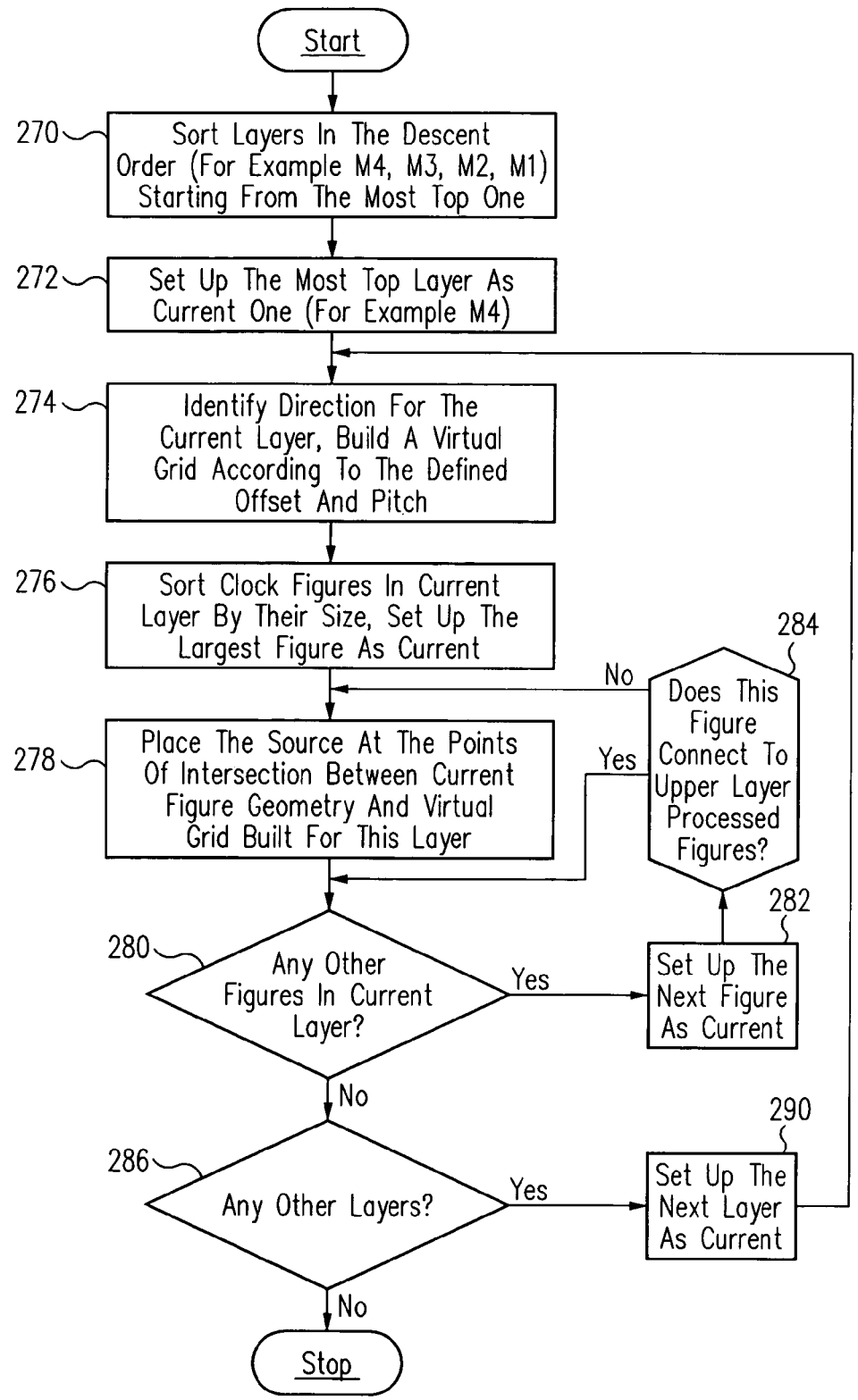
FIG. 12 is a process flow diagram schematically illustrating a method for predicting an intermediate clock skew for an incomplete integrated circuit design in accordance with one embodiment of the present invention.

FIG. 12 schematically illustrates a method for predicting an intermediate clock skew for an incomplete integrated circuit design in accordance with one embodiment of the present invention. For example, this method is performed as the intermediate clock skew prediction (216) discussed above.

As shown in FIG. 12, the metal layers of the circuit design are sorted from the top in the descent order, for example, M4, M3, M2, M1 (270). The most top layer is set as a "current layer" to be processed (272). For example, the metal layer M4 is first set as the current layer. If the metal layer M4 includes no clock design figure, the next metal layer M3 may be set as the current layer. Then, a direction of the clock design figure(s) is identified for the current layer, and a virtual clock grid for the current layer is crated in accordance with a predetermined offset from a design boundary and a predetermined pitch between grid lines (274). Each of the grid lines of a virtual clock grid for a current layer is vertical to the direction of the clock figures in the current layer. In creating a virtual clock grid for a current layer, the offset of the virtual clock grid may be changed such that the virtual clock grid intersects a maximum number of clock design figures in the corresponding metal layer.

Then, the clock design figures in the current layer are sorted in accordance with sizes thereof, and the largest clock design figure is set as a current figure (276). The sorting may include determining the order of the clock design figures based on their sizes, arranging the corresponding data objects of the clock design figures based on the size, or creating the association between the order and the data objects, or the like.

Clock sources locations are placed on intersections between the current clock design figure and the virtual clock grid (278). Then, whether there are any other clock figures on the current layer is determined (280), and if so, a next clock figure is set as the current clock figure (282). For example, the next clock figure may be a second largest clock figure in the current metal layer. Then, it is determined if the current figure is connected to any clock figure on the upper layer, if any, already processed (284). If the current clock figure is connected to an already-processed upper-layer clock figure, the process returns to the determination for a next clock figure (280). If the current clock figure is not connected to any already-processed upper-layer clock figure, the process returns to the placing the clock source locations on the intersections, and the current clock figure is provided with the clock source locations in the same manner (278). It should be noted if the current clock figure is connected to an already-processed clock figure in the current metal layer, not in the upper-layer, the clock figure is provided with the clock source locations. The processes 278–284 are iteratively repeated until no other clock figure is remaining in the current layer.

Similarly, the processes 274–284 are iteratively repeated until no other metal layer having clock figure(s) is remaining (286, 290). For example, a second virtual clock grid for the second metal layer is created in accordance with a second predetermined offset from a design boundary and a second predetermined pitch, and clock source locations are placed on intersections between the second virtual clock grid and a first clock design figure in the second metal layer, if the first clock design figure is not connected to a clock design figure in an upper metal layer. Then, these processes are iteratively repeated until all of the clock design figures have at least one clock source location provided thereon or a connection to an already-processed clock design figure in an upper metal layer.

Figure 13:
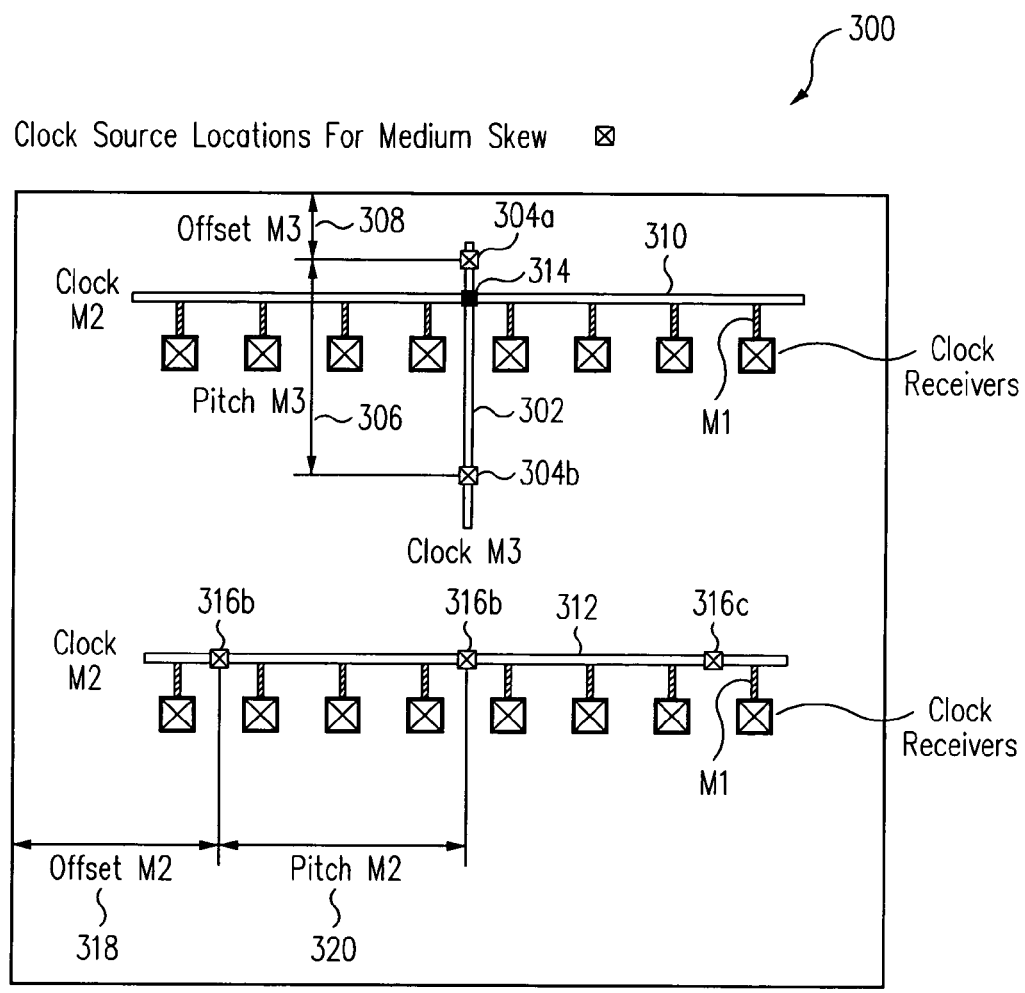
FIG. 13 is a diagram schematically illustrating an example of an incomplete circuit block design and clock source locations placed thereon in accordance with the embodiment of the present invention illustrated in FIG. 12.
Figure 14:
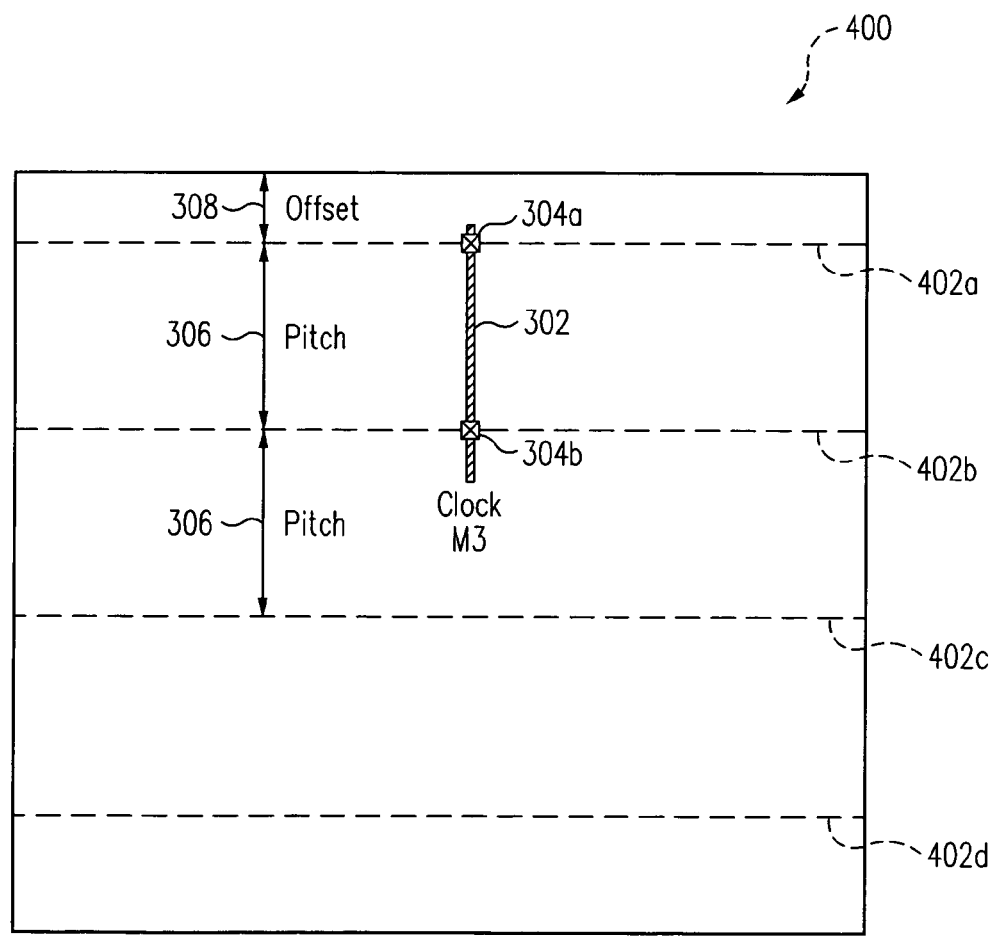
FIG. 14 is a diagram schematically illustrating a virtual clock grid for the metal layer M3 in accordance with one embodiment of the present invention.

FIG. 13 schematically illustrates an example of an incomplete circuit block desing 300 and clock source locations placed thereon in accordance with the above embodiment illustrated in FIG. 12. In this example, clock design figures in the metal layer M4 are missing (as shown in FIG. 5), and thus the metal layer M3 is the first layer including a clock FIG. 302. Clock source locations 304 (304a, 304b) are placed on intersections between the clock FIG. 302 and a virtual clock grid for the metal layer M3, which having a predetermined pitch 306 and a predetermined offset 308. FIG. 14 schematically illustrates the virtual clock grid 400 for the metal layer M3, including grid lines 402a, 402b, ..., which are arranged in accordance with the pitch 306 and the offset 308. It should be noted that FIG. 14 only shows the clock design figure(s) on the metal layer M3.

Figure 15:
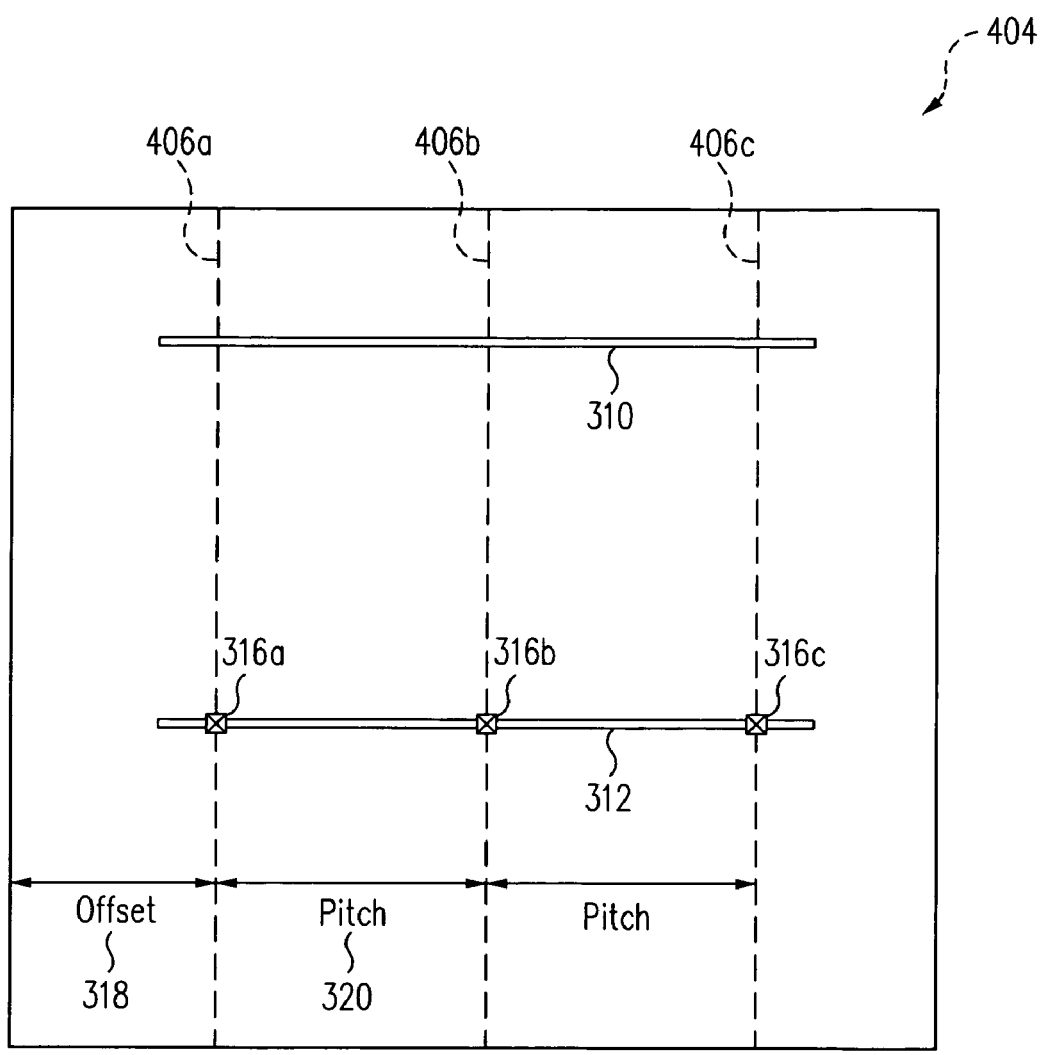
FIG. 15 is a diagram schematically illustrating a virtual clock grid for the metal layer M2 in accordance with one embodiment of the present invention.

Referring back to FIG. 13, since there is no other clock figure in the metal layer M3 in this example, the metal layer M2 is processed, which includes clock FIGS. 310 and 312. The clock FIG. 310 is connected to the clock FIG. 302 in the upper metal layer M3 through a via 314, and thus clock source locations are not placed on the clock FIG. 310, although the clock FIG. 310 would intersect with a virtual clock grid for the metal layer M2. However, the clock FIG. 312 is not connected to any clock figure in the upper metal layer M3, and clock source locations 316 (316a, 316b, ...) are placed on the intersections between the clock FIG. 312 and the virtual grid for the metal layer M2 having a predetermined offset 318 and a predetermined pitch 320. FIG. 15 schematically illustrates the virtual clock grid 404 for the metal layer M2, including grid lines 406a, 406b, ..., which are arranged in accordance with the pitch 320 and the offset 318. It should be noted that FIG. 15 only shows the clock design figure(s) on the metal layer M2.

Figure 16:
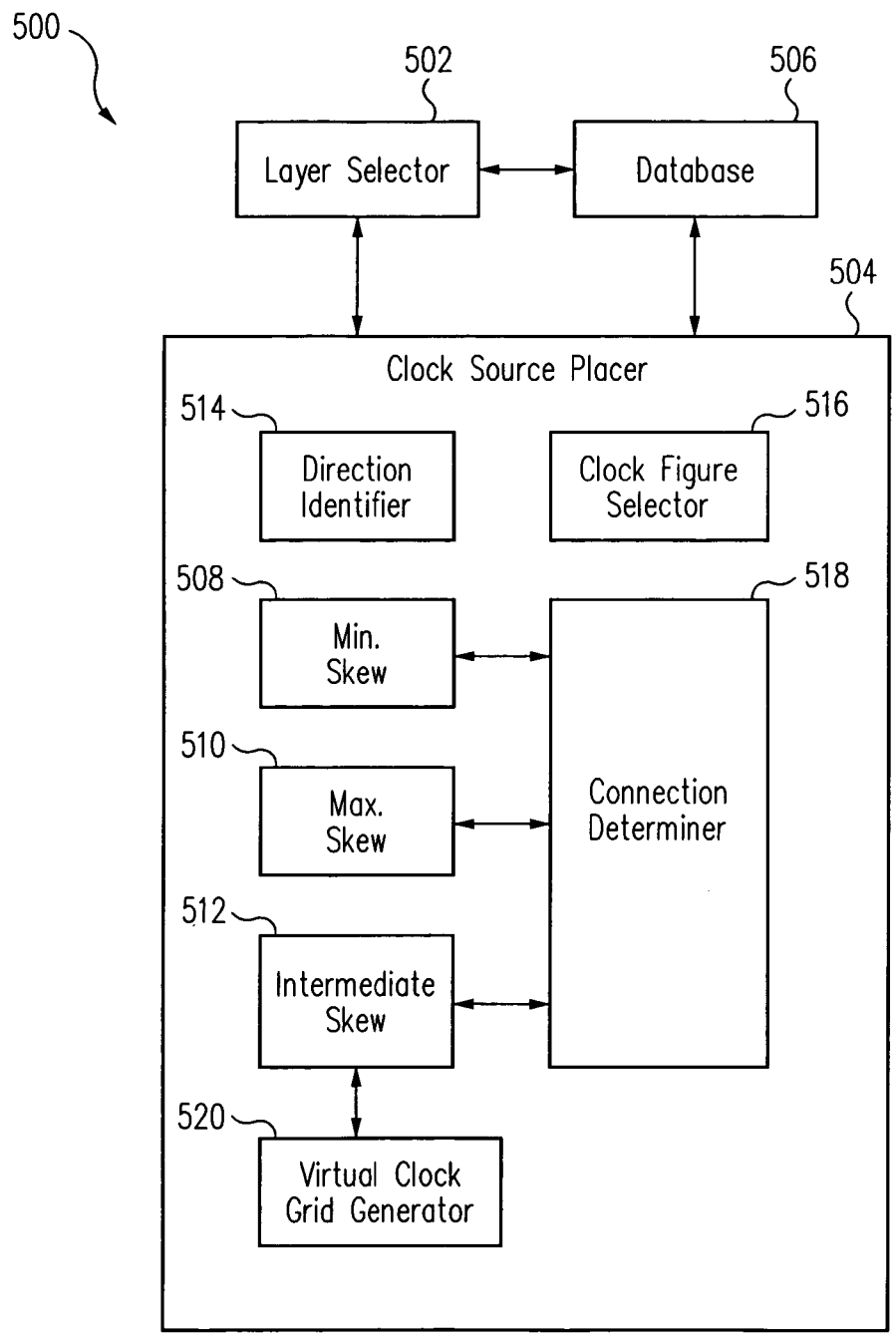
FIG. 16 is a block diagram schematically illustrating a clock skew prediction tool for an incomplete integrated circuit design in accordance with one embodiment of the present invention.

FIG. 16 schematically illustrates a clock skew prediction tool 500 for an incomplete integrated circuit design in accordance with one embodiment of the present invention. The tool 500 may be a computer program or a set of computer program modules capable of running on a computer system such as the computer system 100 described above. The tool 500 is also capable of performing the methods described above. As shown in FIG. 16, the tool 500 includes a layer selector 502 and a clock source placer 504, which are coupled to a database 506. The database 506 contains an incomplete integrated circuit design, which typically has a multi-layered structure and includes at least one clock design figure for routing a clock signal. The database 506 also contains extracted connectivity information such as which design figures belong to the clock network of the circuit design, and which clock figures are connected each other.

The layer selector 502 is adapted to select, from the top, a metal layer having at least one clock design figure. For example, the layer selector 502 sorts the metal layers in accordance with the order from the top of the multi-layered structure. The clock source placer 504 is coupled to the layer selector 502, and adapted to place clock source locations on the clock design figure in a selected metal layer based on a clock skew to be predicted. The clock source placer 504 includes at least one of the following modules: a first module 508 for a minimum skew prediction; a second module 510 for a maximum skew prediction; and a third module 512 for an intermediate skew prediction.

The first module 508 places clock source locations on the clock design figure in accordance with a first predetermined minimum distance between adjacent clock source locations. In accordance with one embodiment of the present invention, the first module 508 places at least one clock location on all clock design figures in a first selected metal layer, and at least one clock source location on the clock design figure in a second selected metal layer in accordance with a second predetermined minimum distance between adjacent clock source locations, if the clock design figure in the second selected metal layer is not connected to a clock design figure in an upper metal layer. The first module 508 may place the clock source locations so as to maximize the number of the clock source locations placed in a clock design figure.

The second module 510 places a clock source location on a first clock design figure having a largest size in the selected layer such that the clock source location has a largest distance from a via to a lower layer. The second module 510 further places a clock source location on a second clock design figure having a next largest size in the selected metal layer, such that the clock source location has a largest distance from a via to a lower layer, if the second clock design figure is not connected to an already processed clock design figure.

The third module 512 places clock source locations on intersections between the clock design figure in the selected metal layer and a virtual clock grid created for the selected metal layer, where the virtual clock grid has a predetermined offset from a design boundary and a predetermined pitch between grid lines thereof. In accordance with one embodiment of the present invention, the third module 512 places clock source locations such that all clock design figures in a first selected metal layer have at least one clock source location thereon. The third module 512 places clock source locations on intersections between a clock design figure in a second selected metal layer and a second virtual clock grid, if the clock design figure in the second selected metal layer does not have a connection to a clock design figure in an upper metal layer.

In accordance with one embodiment of the present invention, the clock source placer 504 further includes a direction identifier 514 coupled to the database 506. The direction identifier 514 identifies a direction of the clock design figures in the metal layer selected by the layer selector 502. The clock source placer 504 may further include a clock design figure selector 516 coupled to the database 506. The design figure selector 516 sorts the clock design figures in accordance with sizes thereof in the selected metal layer, and selects a clock design figure for the current clock source placement process in that order.

In accordance with one embodiment of the present invention, the clock source placer 504 further includes a connection determiner 518 coupled to the first module 508, the second module 510, and/or the third module 512, depending on the module implementation. The connection determiner 518 may be a module, as shown in FIG. 16, or may be a set of modules each provided for determining a specific connectivity. When cooperative with the first module 508 or the third module 512, the connection determiner 518 determines if a clock design figure in the selected metal layer is connected to a clock design figure in an upper metal layer already processed. When cooperative with the second module 510, the connection determiner 518 determines if a clock design figure in the selected metal layer is connected to an already processed clock design figure.

In accordance with one embodiment of the present invention, the clock source placer further includes a virtual clock grid generator 520 coupled to the third module 512. The virtual clock grid generator 520 creates a virtual clock grid having a predetermined offset from a design boundary and a predetermined pitch for a selected metal layer. The virtual clock grid generator 512 may change the offset of a virtual clock grid such that the virtual clock grid intersects a maximum number of clock design figures in a selected metal layer.

In addition, the tool 500 may include a user interface to allow user to select which clock skew (minimum, maximum, or intermediate) to predict, and to define the pitch or distance between the clock source locations, or the pitch and/or offset of the virtual clock grid.

The method and tool described above provide virtual locations for clock signal sources based on user defined parameters and existing design layout available at an early stage in order to complete a required clock net verification procedure. In order to verify the clock parameters at such an early stage, some assumptions should be made in order to evaluate all possible clock signal distribution scenarios such as the best (minimum skew), worst (maximum skew), and standard (intermediate skew) cases.

A set of clock figures physically connected each other in the circuit design forms a clock routing cluster, and at least one clock figure in a given cluster should be long enough to provide the minimum distance between the clock source location and neighbor vias required by the design and electrical rules to predict the maximum clock skew (the worst case scenario). Also, when the user is allowed to define the pitch (distance between clock source locations) and/or offset to predict the minimum (best) or intermediate (standard) clock skew, the user defined pitch/distance and offset are small enough to fit in the design boundary and large enough to maintain design and electrical rules.

Furthermore, in the above-described embodiments, it is assumed, in the minimum-clock-skew case, that clock source locations are distributed uniformly with a distance between each other not less than a user defined value along with the clock routing figures available within the design layout, typically a circuit block, as shown in FIG. 9. As described above, the clock figures in the most top metal layer are taken first. After that, if some clock routing figures are entirely disconnected from the top metal layer, clock figures in the lower metal layers are considered in a descent order of the metal layers. The clock source distribution may be optimized by selecting the metal layers in a descent order, selecting the clock figures in accordance with their sizes in a descent order, and maximizing the number of source locations under the constraint of the required minimum distance between two adjacent clock source locations.

In predicting the maximum-clock-skew, it is assumed that each of the clock routing clusters has just one single clock source on the metal layer which is the most top in that cluster such that the distance between the location of the source and closest vias is maximized.

In predicting the intermediate-clock-skew case, it is assumed that clock sources are distributed according to an imaginary (virtual) clock grid having user-defined offset and pitch. However, the grid offset may be set up for an initial solution, and may be changed in order to cover as many existing clock routing figures as possible. If one or more clock routing clusters are still disconnected, a secondary virtual clock grid is constructed to cover the disconnected cluster(s). This procedure is repeated until all clock routing clusters are covered with clock sources corresponding to the virtual hook-ups from the virtual clock grid. This would give the solution closest to the real clock skew. The optimization can be done by placing the virtual clock grid such that all existing clock routing figures are covered under the virtual grid with the fixed pitch between the grid lines and a variable offset from the design border, so as to place as many virtual clock sources as possible where the clock source locations are placed on intersections between the virtual clock grid and the clock routing figures.

As described above, in accordance with the embodiments of the present invention, the clock skew is predicted and verified in an efficient and accurate manner at the earliest design stage where at least one clock routing figure is available, and also the best-case and worst-case solutions are provided which define the performance range. In addition, since the clock sources are available through clock grid tuning, and therefore design errors are prevented. Furthermore, by reducing the number of iterations during the clock tuning procedure, the design cycle can be speeded up.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A method for predicting a clock skew for an incomplete integrated circuit design including at least one clock design figure for routing a clock signal, said method comprising:
    selecting, from the top, a first metal layer including at least one clock design figure;
    placing, if a minimum clocks skew is to be predicted, clock source locations on the clock design figure in accordance with a first predetermined minimum distance between adjacent clock source locations;
    placing, if a maximum clock skew is to be predicted, a clock source location on a first clock design figure having a largest size in the first layer, such that the clock source location has a largest distance from a via to a lower layer;
    placing, if an intermediate clock skew is to be predicted, clock source locations on intersections between the clock design figure and a virtual clock grid created for the first metal layer, the virtual clock grid having a predetermined offset from a design boundary and a predetermined pitch between grid lines; and
    calculating a clock skew of the incomplete integrated circuit design using the placed clock source locations.

2. The method in accordance with claim 1, further comprising:
    sorting the metal layers from the top; and
    identifying, for each metal layer, a direction of the clock design figures in the metal layer.

3. The method in accordance with claim 1, further comprising:
    sorting clock design figures in accordance with sizes thereof in each metal layer.

4. The method in accordance with claim 1, further comprising, if the minimum clock skew is to be predicted:
    selecting a second metal layer including at least one clock design figure; and
    placing clock source locations on the clock design figure in the second metal layer in accordance with a second predetermined minimum distance between adjacent clock source locations, if the clock design figure in the second metal layer is not connected to a clock design figure in an upper metal layer.

5. The method in accordance with claim 4, wherein all of the clock figures in the first metal layer are provided with at least one clock source location.

6. The method in accordance with claim 4, further comprising:
    iteratively repeating said selecting a second metal layer and said placing clock source locations in the second metal layer until all of the metal layers including at least one clock design figure are processed.

7. The method in accordance with claim 4, wherein said placing clock source locations includes:
    maximizing a number of the clock source locations placed in a clock figure.

8. The method in accordance with claim 1, further comprising, if the maximum clock skew is to be predicted:
    selecting a second clock design figure having a next largest size in the first metal layer; and
    placing a clock source location on the second clock design figure such that the clock source location has a largest distance from a via to a lower layer, if the second clock design figure is not connected to an already processed clock design figure.

9. The method in accordance with claim 8, further comprising:
    iteratively repeating said selecting a second clock design figure and said placing a clock source location on the second clock design figure until all of the clock design figures in the first metal layer are processed.

10. A method in accordance with claim 8, further comprising, if the maximum clock skew is to be predicted:
    selecting a second metal layer including at least one clock design figure;
    selecting a third clock design figure having a largest size in the second metal layer;
    placing a clock source location on the third clock design figure such that the clock source location has a largest distance from a via to a lower layer, if the third clock design figure is not connected to an already processed clock design figure;
    selecting a fourth clock design figure having a next largest size in the second metal layer; and
    placing a clock source location on the fourth clock design figure such that the clock source location has a largest distance from a via to a lower layer, if the fourth clock design figure is not connected to an already processed clock design figure.

11. A method in accordance with claim 10, further comprising:
    iteratively repeating said selecting a fourth clock design figure, and said placing a clock source location on the fourth clock design figure until all of the clock design figures in the second metal layer are processed.

12. The method in accordance with claim 1, further comprising, if the intermediate clock skew is to be predicted:
    selecting a second metal layer including at least one clock design figure;
    creating a second virtual clock grid for the second metal layer, the second virtual clock grid having a second predetermined offset from a design boundary and a second predetermined pitch; and
    placing clock source locations on intersections between the clock design figure in the second metal layer and the second virtual clock grid, if the clock design figure in the second metal layer does not have a connection to a clock design figure in an upper metal layer.

13. The method in accordance with claim 12, wherein all of the clock figures in the first metal layer are provided with at least one clock source location.

14. The method in accordance with claim 12, further comprising:
    iteratively repeating said selecting a second metal layer, said creating a second virtual clock grid, and said placing clock source locations in the second metal layer until all of the clock design figures have at least one clock source location provided therein or a connection to a clock design figure in an upper metal layer.

15. The method in accordance with claim 12, further comprising:
changing the offset of a virtual clock grid such that the virtual clock grid intersects a maximum number of clock design figures in a corresponding metal layer.

16. A method for predicting a clock skew for an incomplete integrated circuit design including at least one clock design figure for routing a clock signal, said method comprising:
selecting, from the top, a first metal layer including at least one clock design figure;
placing clock source locations on the clock design figure in accordance with a first predetermined minimum distance between adjacent clock source locations;
selecting a second metal layer including at least one clock design figure;
determining if the clock design figure in the second metal layer is connected to a clock design figure in an upper metal layer;
placing clock source locations on the clock design figure in the second metal layer in accordance with a second predetermined minimum distance between adjacent clock source locations, if the clock design figure in the second metal layer is not connected to a clock design figure in an upper metal layer;
iteratively repeating said selecting a second metal layer, said determining, and said placing clock source locations in the second metal layer until all of the metal layers including at least one clock design figure are processed; and
calculating a clock skew of the incomplete integrated circuit design using the placed clock source locations.

17. A method for predicting a clock skew for an incomplete integrated circuit design including at least one clock design figure for routing a clock signal, said method comprising:
selecting, from the top, a first metal layer including at least one clock design figure;
selecting a first clock design figure having a largest size in the first metal layer;
placing a clock source location on the first clock design figure such that the clock source location has a largest distance from a via to a lower layer;
selecting a second clock design figure having a next largest size in the first metal layer;
determining if the second clock design figure is connected to an already processed clock design figure;
placing a clock source location on the second clock design figure such that the clock source location has a largest distance from a via to a lower layer, if the second clock design figure is not connected to an already processed clock design figure;
iteratively repeating said selecting a second clock design figure, said determining, and said placing a clock source location on the second clock design figure until all of the clock design figures in the first metal layer are processed; and
calculating a clock skew of the incomplete integrated circuit design using the placed clock source locations.

18. A method in accordance with claim 17, further comprising:
selecting a second metal layer including at least one clock design figure;
selecting a third clock design figure having a largest size in the second metal layer;
determining if the third clock design figure is connected to an already processed clock design figure;
placing a clock source location on the third clock design figure such that the clock source location has a largest distance from a via to a lower layer, if the third clock design figure is not connected to an already processed clock design figure;
selecting a fourth clock design figure having a next largest size in the second metal layer;
determining if the fourth clock design figure is connected to an already processed clock design figure;
placing a clock source location on the fourth clock design figure such that the clock source location has a largest distance from a via to a lower layer, if the fourth clock design figure is not connected to an already processed clock design figure; and
iteratively repeating said selecting a fourth clock design figure, said determining, and said placing a clock source location on the fourth clock design figure until all of the clock design figures in the second metal layer are processed.

19. A method for predicting a clock skew for an incomplete integrated circuit design including at least one clock design figure for routing a clock signal, said method comprising:
selecting, from the top, a first metal layer including at least one clock design figure;
creating a virtual clock grid for the first metal layer, the virtual clock grid having a predetermined offset from a design boundary and a predetermined pitch between grid lines;
placing clock source locations on intersections between the clock design figure and the virtual clock grid;
selecting a second metal layer including at least one clock design figure;
creating a second virtual clock grid for the second metal layer, the second virtual clock grid having a second predetermined offset from a design boundary and a second predetermined pitch;
determining if the clock design figure in the second metal layer is connected to a clock design figure in an upper metal layer;
placing clock source locations on intersections between the clock design figure in the second metal layer and the second virtual clock grid, if the clock design figure in the second metal layer does not have a connection to a clock design figure in an upper metal layer;
iteratively repeating said selecting a second metal layer, said creating a second virtual clock grid, said determining, and said placing clock source locations in the second metal layer until all of the clock design figures have at least one clock source location provided therein or a connection to a clock design figure in an upper metal layer; and
calculating a clock skew of the incomplete integrated circuit design using the placed clock source locations.

20. A clock skew prediction tool for an incomplete integrated circuit design including at least one clock design figure for routing a clock signal, said tool comprising:
a layer selector coupled to a database containing the incomplete integrated circuit design, said layer selector being adapted to select, from the top, a metal layer including at least one clock design figure; and
a clock source placer coupled to said layer selector, said clock source placer being adapted to place clock source locations on the clock design figure in a selected metal layer based on a clock skew to be predicted, said clock source placer including at least one of:

a first module for a minimum skew prediction, said first module being adapted to place clock source locations on the clock design figure in accordance with a first predetermined minimum distance between adjacent clock source locations;

a second module for a maximum skew prediction, said second module being adapted to place a clock source location on a first clock design figure having a largest size in the selected layer such that the clock source location has a largest distance from a via to a lower layer;

a third module for an intermediate skew prediction, said third module being adapted to place clock source locations on intersections between the clock design figure in the selected metal layer and a virtual clock grid created for the selected metal layer, the virtual clock grid having a predetermined offset from a design boundary and a predetermined pitch between grid lines; and calculating a clock skew of the incomplete integrated circuit design using the placed clock source locations.

21. The tool in accordance with claim 20, wherein said layer selector is adapted to sort the metal layers in accordance with the order from the top of a multi-layered structure in the integrated circuit design.

22. The tool in accordance with claim 20, wherein said clock source placer further includes:
a direction identifier coupled to the database, said direction identifier being adapted to identify a direction of the clock design figures in the selected metal layer.

23. The tool in accordance with claim 20, wherein said clock source placer further includes:
a clock design figure selector coupled to the database, said design figure selector being adapted to sort the clock design figures in accordance with sizes thereof in the selected metal layer.

24. The tool in accordance with claim 20, wherein said clock source placer further includes:
a first connection determiner coupled to said first module and said third module, said first connection determiner being adapted to determine if a clock design figure in the selected metal layer is connected to a clock design figure in an upper metal layer.

25. The tool in accordance with claim 24, wherein said first module is adapted to place at least one clock location on all clock design figures in a first selected metal layer.

26. The tool in accordance with claim 24, wherein said first module is adapted to place at least one clock source location on the clock design figure in a second selected metal layer in accordance with a second predetermined minimum distance between adjacent clock source locations, if the clock design figure in the second selected metal layer is not connected to a clock design figure in an upper metal layer.

27. The tool in accordance with claim 20, wherein said first module is adapted to place the clock source locations so as to maximize a number of the clock source locations placed in a clock design figure.

28. The tool in accordance with claim 20, wherein said clock source placer further includes:
a second connection determiner coupled to said second module, said second connection determiner being adapted to determine if a clock design figure in the selected metal layer is connected to an already processed clock design figure.

29. The tool in accordance with claim 28, wherein said second module further adapted to place a clock source location on a second clock design figure having a next largest size in the selected metal layer, such that the clock source location has a largest distance from a via to a lower layer, if the second clock design figure is not connected to an already processed clock design figure.

30. The tool in accordance with claim 20, wherein said clock source placer further comprising:
a virtual clock grid generator coupled to said third module, said virtual clock grid generator being adapted to create a virtual clock grid for a selected metal layer, the virtual clock grid having a predetermined offset from a design boundary and a predetermined pitch.

31. The tool in accordance with claim 30, wherein said third module is adapted to place at least one clock source location on all clock design figures in a first selected metal layer.

32. The tool in accordance with claim 30, wherein said third module is adapted to place clock source locations on intersections between a clock design figure in a second selected metal layer and a second virtual clock grid, if the clock design figure in the second selected metal layer does not have a connection to a clock design figure in an upper metal layer.

33. The tool in accordance with claim 30, wherein said virtual clock grid generator is adapted to change the offset of a virtual clock grid such that the virtual clock grid intersects a maximum number of clock design figures in a selected metal layer.

34. An apparatus for predicting a clock skew for an incomplete integrated circuit design including at least one clock design figure for routing a clock signal, said apparatus comprising:
means for selecting, from the top, a first metal layer including at least one clock design figure;
means for placing, if a minimum clocks skew is to be predicted, clock source locations on the clock design figure in accordance with a first predetermined minimum distance between adjacent clock source locations;
means for placing, if a maximum clock skew is to be predicted, a clock source location on a first clock design figure having a largest size in the first layer, such that the clock source location has a largest distance from a via to a lower layer;
means for placing, if an intermediate clock skew is to be predicted, clock source locations on intersections between the clock design figure and a virtual clock grid created for the first metal layer, the virtual clock grid having a predetermined offset from a design boundary and a predetermined pitch between grid lines; and
means for calculating a clock skew of the incomplete integrated circuit design using the placed clock source locations.

35. The apparatus in accordance with claim 34, further comprising:
means for sorting the metal layers from the top; and
means for identifying, for each metal layer, a direction of the clock design figures in the metal layer.

36. The apparatus in accordance with claim 34, further comprising:
means for sorting clock design figures in accordance with sizes thereof in each metal layer.

37. The apparatus in accordance with claim 34, further comprising, if the minimum clock skew is to be predicted:
means for selecting a second metal layer including at least one clock design figure; and
means for placing clock source locations on the clock design figure in the second metal layer in accordance with a second predetermined minimum distance between adjacent clock source locations, if the clock design figure in the second metal layer is not connected to a clock design figure in an upper metal layer.

38. The apparatus in accordance with claim 37, wherein all of the clock figures in the first metal layer are provided with at least one clock source location.

39. The apparatus in accordance with claim 37, further comprising:
means for iteratively executing said means for selecting a second metal layer and said means for placing clock source locations in the second metal layer until all of the metal layers including at least one clock design figure are processed.

40. The apparatus in accordance with claim 37, wherein means for said placing clock source locations includes:
means for maximizing a number of the clock source locations placed in a clock figure.

41. The apparatus in accordance with claim 34, further comprising, if the maximum clock skew is to be predicted:
means for selecting a second clock design figure having a next largest size in the first metal layer; and
means for placing a clock source location on the second clock design figure such that the clock source location has a largest distance from a via to a lower layer, if the second clock design figure is not connected to an already processed clock design figure.

42. The apparatus in accordance with claim 41, further comprising:
means for iteratively executing said means for selecting a second clock design figure and said means for placing a clock source location on the second clock design figure until all of the clock design figures in the first metal layer are processed.

43. The apparatus in accordance with claim 41, further comprising, if the maximum clock skew is to be predicted:
means for selecting a second metal layer including at least one clock design figure;
means for selecting a third clock design figure having a largest size in the second metal layer;
means for placing a clock source location on the third clock design figure such that the clock source location has a largest distance from a via to a lower layer, if the third clock design figure is not connected to an already processed clock design figure;
means for selecting a fourth clock design figure having a next largest size in the second metal layer; and
means for placing a clock source location on the fourth clock design figure such that the clock source location has a largest distance from a via to a lower layer, if the fourth clock design figure is not connected to an already processed clock design figure.

44. The apparatus in accordance with claim 43, further comprising:
means for iteratively executing said means for selecting a fourth clock design figure, and said means for placing a clock source location on the fourth clock design figure until all of the clock design figures in the second metal layer are processed.

45. The apparatus in accordance with claim 34, further comprising, if the intermediate clock skew is to be predicted:
means for selecting a second metal layer including at least one clock design figure;
means for creating a second virtual clock grid for the second metal layer, the second virtual clock grid having a second predetermined offset from a design boundary and a second predetermined pitch; and
means for placing clock source locations on intersections between the clock design figure in the second metal layer and the second virtual clock grid, if the clock design figure in the second metal layer does not have a connection to a clock design figure in an upper metal layer.

46. The apparatus in accordance with claim 45, wherein all of the clock figures in the first metal layer are provided with at least one clock source location.

47. The apparatus in accordance with claim 45, further comprising:
means for iteratively executing said means for selecting a second metal layer, said means for creating a second virtual clock grid, and said means for placing clock source locations in the second metal layer until all of the clock design figures have at least one clock source location provided therein or a connection to a clock design figure in an upper metal layer.

48. The apparatus in accordance with claim 45, further comprising:
means for changing the offset of a virtual clock grid such that the virtual clock grid intersects a maximum number of clock design figures in a corresponding metal layer.

49. The apparatus for predicting a clock skew for an incomplete integrated circuit design including at least one clock design figure for routing a clock signal, said apparatus comprising:
means for selecting, from the top, a first metal layer including at least one clock design figure;
means for placing clock source locations on the clock design figure in accordance with a first predetermined minimum distance between adjacent clock source locations;
means for selecting a second metal layer including at least one clock design figure;
means for determining if the clock design figure in the second metal layer is connected to a clock design figure in an upper metal layer;
means for placing clock source locations on the clock design figure in the second metal layer in accordance with a second predetermined minimum distance between adjacent clock source locations, if the clock design figure in the second metal layer is not connected to a clock design figure in an upper metal layer;
means for iteratively executing said means for selecting a second metal layer, said means for determining, and said means for placing clock source locations in the second metal layer until all of the metal layers including at least one clock design figure are processed; and
means for calculating a clock skew of the incomplete integrated circuit design using the placed clock source locations.

50. The apparatus for predicting a clock skew for an incomplete integrated circuit design including at least one clock design figure for routing a clock signal, said apparatus comprising:
means for selecting, from the top, a first metal layer including at least one clock design figure;
means for selecting a first clock design figure having a largest size in the first metal layer;
means for placing a clock source location on the first clock design figure such that the clock source location has a largest distance from a via to a lower layer;
means for selecting a second clock design figure having a next largest size in the first metal layer;

means for determining if the second clock design figure is connected to an already processed clock design figure;

means for placing a clock source location on the second clock design figure such that the clock source location has a largest distance from a via to a lower layer, if the second clock design figure is not connected to an already processed clock design figure;

means for iteratively executing said means for selecting a second clock design figure, said means for determining, and said means for placing a clock source location on the second clock design figure until all of the clock design figures in the first metal layer are processed; and means for calculating a clock skew of the incomplete integrated circuit design using the placed clock source locations.

51. The apparatus in accordance with claim 50, further comprising:

means for selecting a second metal layer including at least one clock design figure;

means for selecting a third clock design figure having a largest size in the second metal layer;

means for determining if the third clock design figure is connected to an already processed clock design figure;

means for placing a clock source location on the third clock design figure such that the clock source location has a largest distance from a via to a lower layer, if the third clock design figure is not connected to an already processed clock design figure;

means for selecting a fourth clock design figure having a next largest size in the second metal layer;

means for determining if the fourth clock design figure is connected to an already processed clock design figure;

means for placing a clock source location on the fourth clock design figure such that the clock source location has a largest distance from a via to a lower layer, if the fourth clock design figure is not connected to an already processed clock design figure; and means for iteratively executing said means for selecting a fourth clock design figure, said means for determining, and said means for placing a clock source location on the fourth clock design figure until all of the clock design figures in the second metal layer are processed.

52. The apparatus for predicting a clock skew for an incomplete integrated circuit design including at least one clock design figure for routing a clock signal, said apparatus comprising:

means for selecting, from the top, a first metal layer including at least one clock design figure;

means for creating a virtual clock grid for the first metal layer, the virtual clock grid having a predetermined offset from a design boundary and a predetermined pitch between grid lines;

means for placing clock source locations on intersections between the clock design figure and the virtual clock grid;

means for selecting a second metal layer including at least one clock design figure;

means for creating a second virtual clock grid for the second metal layer, the second virtual clock grid having a second predetermined offset from a design boundary and a second predetermined pitch;

means for determining if the clock design figure in the second metal layer is connected to a clock design figure in an upper metal layer;

means for placing clock source locations on intersections between the clock design figure in the second metal layer and the second virtual clock grid, if the clock design figure in the second metal layer does not have a connection to a clock design figure in an upper metal layer;

means for iteratively executing said means for selecting a second metal layer, said means for creating a second virtual clock grid, said means for determining, and means for said placing clock source locations in the second metal layer until all of the clock design figures have at least one clock source location provided therein or a connection to a clock design figure in an upper metal layer; and calculating a clock skew of the incomplete integrated circuit design using the placed clock source locations.

53. A program storage device readable by a machine, tangibly embodying a program of instructions executable by the machine to perform a method for predicting a clock skew for an incomplete integrated circuit design including at least one clock design figure for routing a clock signal, said method comprising:

selecting, from the top, a first metal layer including at least one clock design figure;

placing, if a minimum clocks skew is to be predicted, clock source locations on the clock design figure in accordance with a first predetermined minimum distance between adjacent clock source locations;

placing, if a maximum clock skew is to be predicted, a clock source location on a first clock design figure having a largest size in the first layer, such that the clock source location has a largest distance from a via to a lower layer;

placing, if an intermediate clock skew is to be predicted, clock source locations on intersections between the clock design figure and a virtual clock grid created for the first metal layer, the virtual clock grid having a predetermined offset from a design boundary and a predetermined pitch between grid lines; and calculating a clock skew of the incomplete integrated circuit design using the placed clock source locations.

54. The program storage device in accordance with claim 53, wherein said method further comprises, if the minimum clock skew is to be predicted:

selecting a second metal layer including at least one clock design figure; and placing clock source locations on the clock design figure in the second metal layer in accordance with a second predetermined minimum distance between adjacent clock source locations, if the clock design figure in the second metal layer is not connected to a clock design figure in an upper metal layer.

55. The program storage device in accordance with claim 54, wherein said method further comprises:

iteratively repeating said selecting a second metal layer and said placing clock source locations in the second metal layer until all of the metal layers including at least one clock design figure are processed.

56. The program storage device in accordance with claim 53, wherein said method further comprises, if the maximum clock skew is to be predicted:

selecting a second clock design figure having a next largest size in the first metal layer; and placing a clock source location on the second clock design figure such that the clock source location has a largest distance from a via to a lower layer, if the second clock design figure is not connected to an already processed clock design figure.

57. The program storage device in accordance with claim 56, wherein said method further comprises:
iteratively repeating said selecting a second clock design figure and said placing a clock source location on the second clock design figure until all of the clock design figures in the first metal layer are processed.

58. The program storage device in accordance with claim 56, wherein said method further comprises, if the maximum clock skew is to be predicted:
selecting a second metal layer including at least one clock design figure;
selecting a third clock design figure having a largest size in the second metal layer;
placing a clock source location on the third clock design figure such that the clock source location has a largest distance from a via to a lower layer, if the third clock design figure is not connected to an already processed clock design figure;
selecting a fourth clock design figure having a next largest size in the second metal layer; and
placing a clock source location on the fourth clock design figure such that the clock source location has a largest distance from a via to a lower layer, if the fourth clock design figure is not connected to an already processed clock design figure.

59. The program storage device in accordance with claim 58, wherein said method further comprises:
iteratively repeating said selecting a fourth clock design figure, and said placing a clock source location on the fourth clock design figure until all of the clock design figures in the second metal layer are processed.

60. The program storage device in accordance with claim 53, wherein said method further comprises, if the intermediate clock skew is to be predicted:
selecting a second metal layer including at least one clock design figure;
creating a second virtual clock grid for the second metal layer, the second virtual clock grid having a second predetermined offset from a design boundary and a second predetermined pitch; and
placing clock source locations on intersections between the clock design figure in the second metal layer and the second virtual clock grid, if the clock design figure in the second metal layer does not have a connection to a clock design figure in an upper metal layer.

61. The program storage device in accordance with claim 60, wherein said method further comprises:
iteratively repeating said selecting a second metal layer, said creating a second virtual clock grid, and said placing clock source locations in the second metal layer until all of the clock design figures have at least one clock source location provided therein or a connection to a clock design figure in an upper metal layer.

62. The program storage device in accordance with claim 60, wherein said method further comprises:
changing the offset of a virtual clock grid such that the virtual clock grid intersects a maximum number of clock design figures in a corresponding metal layer.

63. A program storage device readable by a machine, tangibly embodying a program of instructions executable by the machine to perform a method for predicting a clock skew for an incomplete integrated circuit design including at least one clock design figure for routing a clock signal, said method comprising:
selecting, from the top, a first metal layer including at least one clock design figure;
placing clock source locations on the clock design figure in accordance with a first predetermined minimum distance between adjacent clock source locations;
selecting a second metal layer including at least one clock design figure;
determining if the clock design figure in the second metal layer is connected to a clock design figure in an upper metal layer;
placing clock source locations on the clock design figure in the second metal layer in accordance with a second predetermined minimum distance between adjacent clock source locations, if the clock design figure in the second metal layer is not connected to a clock design figure in an upper metal layer;
iteratively repeating said selecting a second metal layer, said determining, and said placing clock source locations in the second metal layer until all of the metal layers including at least one clock design figure are processed; and
calculating a clock skew of the incomplete integrated circuit design using the placed clock source locations.

64. A program storage device readable by a machine, tangibly embodying a program of instructions executable by the machine to perform a method for predicting a clock skew for an incomplete integrated circuit design including at least one clock design figure for routing a clock signal, said method comprising:
selecting, from the top, a first metal layer including at least one clock design figure;
selecting a first clock design figure having a largest size in the first metal layer;
placing a clock source location on the first clock design figure such that the clock source location has a largest distance from a via to a lower layer;
selecting a second clock design figure having a next largest size in the first metal layer;
determining if the second clock design figure is connected to an already processed clock design figure;
placing a clock source location on the second clock design figure such that the clock source location has a largest distance from a via to a lower layer, if the second clock design figure is not connected to an already processed clock design figure;
iteratively repeating said selecting a second clock design figure, said determining, and said placing a clock source location on the second clock design figure until all of the clock design figures in the first metal layer are processed; and
calculating a clock skew of the incomplete integrated circuit design using the placed clock source locations.

65. The program storage device in accordance with claim 64, wherein said method further comprises:
selecting a second metal layer including at least one clock design figure;
selecting a third clock design figure having a largest size in the second metal layer;
determining if the third clock design figure is connected to an already processed clock design figure;
placing a clock source location on the third clock design figure such that the clock source location has a largest distance from a via to a lower layer, if the third clock design figure is not connected to an already processed clock design figure;
selecting a fourth clock design figure having a next largest size in the second metal layer;
determining if the fourth clock design figure is connected to an already processed clock design figure;

placing a clock source location on the fourth clock design figure such that the clock source location has a largest distance from a via to a lower layer, if the fourth clock design figure is not connected to an already processed clock design figure; and iteratively repeating said selecting a fourth clock design figure, said determining, and said placing a clock source location on the fourth clock design figure until all of the clock design figures in the second metal layer are processed.

66. A program storage device readable by a machine, tangibly embodying a program of instructions executable by the machine to perform a method for predicting a clock skew for an incomplete integrated circuit design including at least one clock design figure for routing a clock signal, said method comprising:

selecting, from the top, a first metal layer including at least one clock design figure;

creating a virtual clock grid for the first metal layer, the virtual clock grid having a predetermined offset from a design boundary and a predetermined pitch between grid lines;

placing clock source locations on intersections between the clock design figure and the virtual clock grid;

selecting a second metal layer including at least one clock design figure;

creating a second virtual clock grid for the second metal layer, the second virtual clock grid having a second predetermined offset from a design boundary and a second predetermined pitch;

determining if the clock design figure in the second metal layer is connected to a clock design figure in an upper metal layer;

placing clock source locations on intersections between the clock design figure in the second metal layer and the second virtual clock grid, if the clock design figure in the second metal layer does not have a connection to a clock design figure in an upper metal layer;

iteratively repeating said selecting a second metal layer, said creating a second virtual clock grid, said determining, and said placing clock source locations in the second metal layer until all of the clock design figures have at least one clock source location provided therein or a connection to a clock design figure in an upper metal layer; and calculating a clock skew of the incomplete integrated circuit design using the placed clock source locations.

* * * * *